(12) United States Patent
Finn

(10) Patent No.: US 7,979,975 B2
(45) Date of Patent: Jul. 19, 2011

(54) METHODS OF CONNECTING AN ANTENNA TO A TRANSPONDER CHIP

(75) Inventor: David Finn, Tourmakeady (IE)

(73) Assignee: Feinics Amatech Teavanta, Lower Churchfield, Tourmakeady, County Mayo (IR)

(*) Notice: Subject to any disclaimer, the term of this patent is extended or adjusted under 35 U.S.C. 154(b) by 310 days.

(21) Appl. No.: 12/200,926

(22) Filed: Aug. 28, 2008

(65) Prior Publication Data
US 2009/0213027 A1    Aug. 27, 2009

Related U.S. Application Data

(63) Continuation-in-part of application No. 11/733,756, filed on Apr. 10, 2007, now Pat. No. 7,546,671, and a continuation-in-part of application No. 11/773,434, filed on Jul. 5, 2007, now Pat. No. 7,581,308, and a continuation-in-part of application No. 11/831,987, filed on Aug. 1, 2007.

(60) Provisional application No. 60/971,581, filed on Sep. 12, 2007.

(51) Int. Cl.
*H01R 4/00* (2006.01)

(52) U.S. Cl. ............. 29/592.1; 29/600; 29/825; 29/831; 235/492; 343/700 R

(58) Field of Classification Search ............. 229/592.1, 229/600, 825, 831; 235/492; 343/700 R
See application file for complete search history.

(56) References Cited

U.S. PATENT DOCUMENTS

| | | |
|---|---|---|
| 3,674,914 A | 7/1972 | Burr |
| 4,437,603 A | 3/1984 | Kobayashi et al. |
| 4,533,787 A | 8/1985 | Anderegg et al. |
| 4,641,773 A | 2/1987 | Morino et al. |
| 4,693,778 A | 9/1987 | Swiggett et al. |
| 4,730,188 A | 3/1988 | Milheiser |
| 4,884,334 A | 12/1989 | Houser et al. |
| 4,912,143 A | 3/1990 | Ahn et al. |
| 5,041,826 A | 8/1991 | Milheiser |
| 5,083,087 A | 1/1992 | Fox et al. |
| 5,094,907 A | 3/1992 | Yamamura et al. |
| 5,166,676 A | 11/1992 | Milheiser |
| 5,201,453 A | 4/1993 | Amador et al. |
| 5,211,129 A | 5/1993 | Taylor et al. |

(Continued)

FOREIGN PATENT DOCUMENTS

CA    2555034    9/2005

(Continued)

*Primary Examiner* — C. J Arbes
(74) *Attorney, Agent, or Firm* — Gerald E. Linden

(57) ABSTRACT

An antenna wire (210, 260, 310, 410, 510, 610, 710) is mounted to a substrate (204, 254, 304, 404, 504, 604, 704) so that end portions (210*a/b*, 260*a/b*, 310*a/b*, 410*a/b*, 510*a/b*, 610*a/b*, 710*a/b*) of the wire are spaced far enough apart for a transponder chip (208, 250, 308, 408, 508, 608, 708) to be positioned therebetween, such as into a recess (206, 256, 306, 406, 506, 606, 706) in the substrate. The end portions are left unmounted, as "wire bridges", "jump loops", or "flat loops". The end portions may be re-positioned to be over the terminals (208*a/b*, 258*a/b*, 308*a/b*, 408*a/b*, 508*a/b*, 608*a/b*, 708*a/b*) of the chip for bonding. Or, the chip (or substrate) may be moved (such as side-to-side, or rotated) so that the chip's terminals are under the end portions of the wire for bonding. Insulation may be removed from the end portions of the wire prior to bonding.

23 Claims, 10 Drawing Sheets

U.S. PATENT DOCUMENTS

| | | | |
|---|---|---|---|
| 5,281,855 | A | 1/1994 | Hadden et al. |
| 5,340,946 | A | 8/1994 | Friedrich et al. |
| 5,365,657 | A | 11/1994 | Brown et al. |
| 5,491,302 | A | 2/1996 | Distefano et al. |
| 5,773,812 | A | 6/1998 | Kreft |
| 5,786,626 | A * | 7/1998 | Brady et al. ................ 257/673 |
| 5,809,633 | A | 9/1998 | Mundigl et al. |
| 6,008,993 | A | 12/1999 | Kreft |
| 6,088,230 | A | 7/2000 | Finn et al. |
| 6,095,423 | A | 8/2000 | Houdeau et al. |
| 6,095,915 | A | 8/2000 | Geissler |
| 6,100,804 | A * | 8/2000 | Brady et al. .............. 340/572.7 |
| 6,107,920 | A | 8/2000 | Eberhardt et al. |
| 6,140,707 | A | 10/2000 | Plepys et al. |
| 6,142,381 | A | 11/2000 | Finn et al. |
| 6,190,942 | B1 | 2/2001 | Wilm et al. |
| 6,206,292 | B1 | 3/2001 | Robertz et al. |
| 6,233,818 | B1 | 5/2001 | Finn et al. |
| 6,259,369 | B1 | 7/2001 | Monico |
| 6,288,443 | B1 | 9/2001 | Finn et al. |
| 6,310,778 | B1 | 10/2001 | Finn et al. |
| 6,471,878 | B1 | 10/2002 | Greene et al. |
| 6,521,829 | B2 | 2/2003 | Matsumura et al. |
| 6,606,247 | B2 | 8/2003 | Credelle et al. |
| 6,626,364 | B2 | 9/2003 | Taban |
| 6,628,240 | B2 | 9/2003 | Amadeo |
| 6,667,092 | B1 | 12/2003 | Brollier et al. |
| 6,677,917 | B2 | 1/2004 | Van Heerden et al. |
| 6,698,089 | B2 | 3/2004 | Finn et al. |
| 6,870,497 | B2 | 3/2005 | Kondo et al. |
| 6,956,182 | B2 | 10/2005 | Gregory |
| 7,011,980 | B1 | 3/2006 | Na et al. |
| 7,176,053 | B1 | 2/2007 | Dimmler |
| 7,546,671 | B2 * | 6/2009 | Finn ............................ 29/592.1 |
| 7,581,308 | B2 * | 9/2009 | Finn ............................... 29/600 |
| 2002/0020903 | A1 | 2/2002 | Kreft et al. |
| 2004/0089707 | A1 | 5/2004 | Cortina et al. |
| 2004/0155114 | A1 | 8/2004 | Rietzler |
| 2005/0206524 | A1 | 9/2005 | Forster et al. |
| 2005/0282355 | A1 | 12/2005 | Edwards et al. |
| 2005/0282495 | A1 | 12/2005 | Forster |
| 2006/0114109 | A1 | 6/2006 | Geissler |
| 2007/0130754 | A1 | 6/2007 | Fein |
| 2007/0290051 | A1 | 12/2007 | Bielmann et al. |

FOREIGN PATENT DOCUMENTS

| | | |
|---|---|---|
| DE | 28 11 458 | 2/1979 |
| DE | 36 22 246 | 1/1987 |
| DE | 42 05 084 | 9/1993 |
| DE | 195 25 933 | 1/1997 |
| DE | 195 41 039 | 5/1997 |
| DE | 196 10 507 | 9/1997 |
| DE | 196 16 424 | 10/1997 |
| DE | 196 54 902 | 10/1997 |
| DE | 196 34 473 | 1/1998 |
| DE | 196 46 717 | 5/1998 |
| DE | 196 51 566 | 6/1998 |
| DE | 197 16 912 | 11/1998 |
| DE | 197 41 984 | 6/1999 |
| DE | 198 50 353 | 3/2000 |
| DE | 199 20 593 | 11/2000 |
| DE | 10 2004 043 747 | 3/2006 |
| DE | 20 2005 016 382 | 3/2006 |
| DE | 20 2007 01 368 | 1/2008 |
| GB | 1 593 235 | 7/1981 |
| JP | 6-351194 A | 12/1994 |
| WO | WO 91 16718 | 10/1991 |
| WO | WO 95 26538 | 10/1995 |
| WO | WO 97 30418 | 8/1997 |
| WO | WO 97 35273 | 9/1997 |
| WO | WO 00/21030 | 4/2000 |
| WO | WO 00/36891 | 6/2000 |
| WO | WO 00 68994 | 11/2000 |
| WO | WO 2006 050691 | 5/2006 |

* cited by examiner

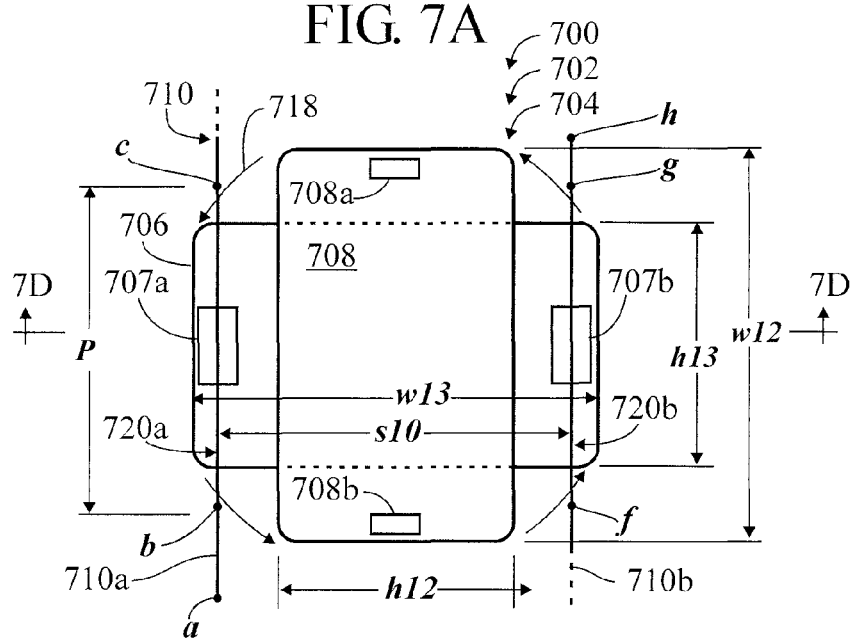
FIG. 7A
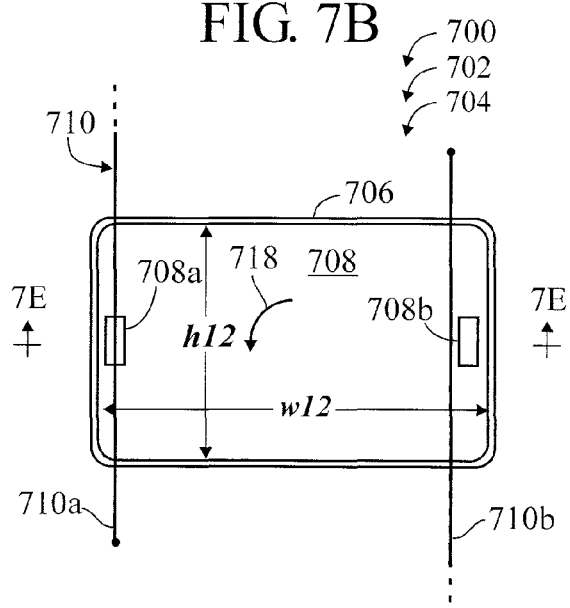
FIG. 7B
FIG. 7C
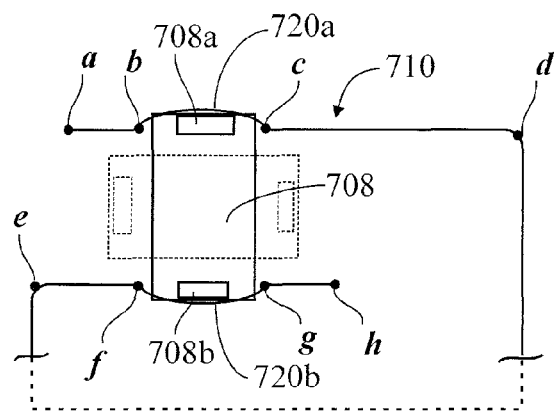

METHODS OF CONNECTING AN ANTENNA TO A TRANSPONDER CHIP

FIELD OF THE INVENTION

The invention relates to mounting an antenna wire (or antenna coil) on a substrate, and connecting end portions of the antenna wire to terminals of a transponder chip (or chip unit) which is also mounted to the substrate (or to an underlying substrate).

The invention relates to techniques for interconnection of lead wires to an integrated circuit (IC), such as in the context of an inlay having a wire which is an antenna wire mounted such as by embedding the wire to the surface of a substrate, followed by bonding end portions of the antenna wire to terminals (bond pads) of the IC (such as transponder chip or chip module) disposed on the substrate or in a recess in the substrate.

BACKGROUND OF THE INVENTION

A conventional method to produce an inlay site containing a high frequency RFID chip and an antenna embedded into a multi-layer substrate and connected to the terminals (terminal areas) of the RFID chip is to first position the RFID chip in a recess, supported by a lower substrate layer, then start embedding (countersinking) a wire conductor onto or into the top substrate layer in the direction of the RFID chip, then guiding the wire conductor over a first terminal area of the RFID chip, then continue the embedding process by forming an antenna in the top substrate layer with a given number of turns, then guiding the wire conductor over the second terminal area, and finally embedding the wire conductor again into the top substrate layer before cutting the wire to complete the high frequency transponder site. In a next stage of the production process, the wire ends passing over the terminal areas are interconnected by means of thermal compression bonding. Adhesively placing a wire conductor onto the top substrate layer is an alternative to embedding, and typically involves self-bonding coated wire conductor.

A wire embedding apparatus may be an ultrasonic wire guide tool, known as a "sonotrode", with a wire feed channel (capillary) passing through the centre of the wire guide tool. The wire conductor is fed through the wire guide tool, emerges from the tip, and by application of pressure and ultrasonic energy the wire conductor is "rubbed" into the substrate, resulting in localised heating of the wire conductor and subsequent sinking of the wire conductor into the substrate material during the movement of the wire guide tool. A wire placement apparatus may also be an ultrasonic tool similar in function to an ultrasonic horn which heats the wire to form an adhesion with a substrate.

U.S. Pat. No. 6,698,089 ("089 patent"), incorporated by reference in its entirety herein, discloses device for bonding a wire conductor. Device for the contacting of a wire conductor in the course of the manufacture of a transponder unit arranged on a substrate and comprising a wire coil and a chip unit, wherein in a first phase the wire conductor is guided away via the terminal area or a region accepting the terminal area and is fixed on the substrate relative to the terminal area or the region assigned to the terminal area by a wire guide and a portal, and in a second phase the connection of the wire conductor to the terminal area is effected by means of a connecting instrument. FIGS. 1 and 2 of the 089 patent show a wire conductor 20 being embedded in a surface of a substrate 21, by the action of ultrasound. FIG. 3 of the 089 patent shows a wiring device 22 with an ultrasonic generator 34, suitable for embedding the wire. It is believed that the wiring device in the 089 patent can also be used for adhesively placing a wire.

U.S. Pat. No. 5,281,855, incorporated by reference in its entirety herein, discloses a method and apparatus for facilitating interconnection of lead wires to an integrated circuit including the provision of an additional protective layer of insulation to the top of an integrated circuit chip or die and the provision of enlarged plated electrodes to the surface of the additional insulation to form enhanced bonding pads, such pads being electrically connected through the protective layers to the normal bonding pads of the integrated circuit device. The enhanced bonding pads are made of a soft conductive metal such that external wires to be attached thereto can be bonded to the pads using a thermal compression bonding technique.

U.S. Pat. No. 6,088,230, incorporated by reference in its entirety herein, discloses a procedure for producing a transponder unit (55) provided with at least one chip (16) and one coil (18), and in particular a chip card/chip-mounting board (17) wherein the chip and the coil are mounted on one common substrate (15) and the coil is formed by installing a coil wire (21) and connecting the coil-wire ends (19, 23) to the contact surfaces (20, 24) of the chip on the substrate.

Canada Patent Application CA 2555034 discloses a method for the production of a book-type security document with at least one security cambric (15) and at least one transponder unit (21), characterized in that: at least one laminated layer (22, 23) is applied at least on one side of the at least one security cambric (4 5) and on at least one side of the at least one transponder unit (21); the at least one security cambric (15) and the at least one transponder unit (21) are fully encompassed by the laminated layers (22, 23) and that a circumferential, closed edge (24) is provided by the laminated layers (22, 231, and that a laminated layer sheath (25) is formed.

U.S. Pat. No. 7,229,022 discloses method for producing a contactless chip card and chip card. A method for producing a transponder, especially a contactless chip card (1) comprises at least one electronic component (chip module 2) and at least one antenna (3); the at least one electronic chip component (2) being disposed on a non-conducting substrate that serves as a support for the component. The at least one antenna is also disposed on a non-conducting substrate, the at least one electronic component (2) being applied to a first substrate and the antenna (3) on a second substrate. The entire circuit (1) is then produced by joining the individual substrates so that they are correctly positioned relative to each other. The components (2, 3) are contacted once the different substrates have been joined by means of auxiliary materials such as solder or glue, or without auxiliary materials by microwelding. The non-conducting substrates form a base card body.

PCT/US99/28795 (WO 00/36891), incorporated by reference in its entirety herein, discloses methods for wire-scribing filament circuit patterns with planar and non-planar portions. An apparatus and method of forming filament circuit patterns with planar and non-planar portions and interconnection cards, smart cards or optical fiber circuit cards formed therefrom are provided. A filament circuit path is scribed by moving a filament guide and a substrate relative to one another, and dispensing a filament on, or in the vicinity of, a surface of the substrate. The filament or the substrate or both have adhesive surface(s). The adhesive surface is capable of being adhesively actuated by application of energy. Energy is applied simultaneous with, or subsequent to, scribing. A portion of the filament circuit pattern is planar and another portion is non-planar. The non-planar portion traverses but does not contact or adhere to a pre-selected area of the substrate. The pre-selected area corresponds with a pad, a contact pattern, a hole, a slot, a raised feature, a part of the previously scribed planar portion of the pattern, and a filament termination point. Alternately, the non-planar portion may be embedded below the surface of the substrate. Another planar portion of the filament circuit traverses the non-planar portion but does not contact or adhere to a pre-selected part of the previously scribed non-planar portion. According to the above method wire-scribed circuit boards are formed including interconnection cards, smart cards or optical fiber circuit cards.

An Inlay and Transponder of the Prior Art

FIGS. 1A and 1B illustrate an inlay substrate (or sheet) 100 having a plurality of transponder areas. A selected one of the transponder areas 102 constituting a single transponder is shown in detail. The vertical and horizontal dashed lines (in FIG. 1A) are intended to indicate that there may be additional transponder areas (and corresponding additional transponders) disposed to the left and right of, as well as above and below, the transponder area 102, on the inlay sheet 100. Such a plurality of transponders may be arranged in an array on the (larger) inlay sheet. As best viewed in FIG. 1B, the inlay sheet 100 may be a multi-layer substrate 104 comprising one or more upper (top) layers 104a and one or more lower (bottom) layers 104b.

A recess 106 may be formed in (through) the upper layer 104a, at a "transponder chip site", so that a transponder chip 108 may be disposed in the recess, and supported by the lower layer 104b. The transponder chip 108 is shown having two terminals 108a and 108b on a top surface thereof. The transponder chip 108 may be a chip module, or an RFID chip.

Generally, the recess 106 is sized and shaped to accurately position the transponder chip 108, having side dimensions only slightly larger than the transponder chip 108 to allow the transponder chip 108 to be located within the recess. For example, 1. the transponder chip 108 may measure: 5.0×8.0 mm
2. the recess 106 may measure: 5.1×8.1 mm
3. the terminals 108a/b may measure: 5.0×1.45 mm
4. the wire (discussed below) may have a diameter between 60 and 112 µm One millimeter (mm) equals one thousand (1000) micrometers (µm, "micron").

In FIGS. 1A and 1B, the recess 106 may be illustrated with an exaggerated gap between its inside edges and the outside edges of the chip 108, for illustrative clarity. In reality, the gap may be only approximately 50 µm-100 µm (0.05 mm-0.1 mm).

In FIG. 1A the terminals 108a and 108b are shown reduced in size (narrower in width), for illustrative clarity. (From the dimensions given above, it is apparent that the terminals 108a and 108b can extend substantially the full width of the transponder chip 108.)

It should be understood that the transponder chip 108 is generally snugly received within the recess 106, with dimensions suitable that the chip 108 does not move around after being located within the recess 106, in anticipation of the wire ends 110a, 110b being bonded to the terminals 108a, 108b. As noted from the exemplary dimensions set forth above, only very minor movement of the chip 108, such as a small fraction of a millimeter (such as 50 µm-100 µm) can be tolerated.

As best viewed in FIG. 1A, an antenna wire 110 is disposed on a top surface (side) of the substrate, and may be formed into a flat (generally planar) coil, having two end portions 110a and 110b.

As best viewed in FIG. 1B, the antenna wire is "mounted" to the substrate, which includes "embedding" (countersinking) the antenna wire into the surface of the substrate, or "adhesively placing" (adhesively sticking) the antenna wire on the surface of the substrate. In either case (embedding or adhesively placing), the wire typically feeds out of a capillary 116 of an ultrasonic wire guide tool (not shown). The capillary 116 is typically disposed perpendicular to the surface of the substrate 100. The capillary 116 is omitted from the view in FIG. 1A, for illustrative clarity.

The antenna wire 110 may be considered "heavy" wire (such as 60 µm-112 µm), which requires higher bonding loads than those used for "fine" wire (such as 30 µm). Rectangular section copper ribbon (such as 60×30 µm) can be used in place of round wire.

The capillary 116 may be vibrated by an ultrasonic vibration mechanism (not shown), so that it vibrates in the vertical or longitudinal (z) direction, such as for embedding the wire in the surface of the substrate, or in a horizontal or transverse (y) direction, such as for adhesively placing the wire on the surface of the substrate. In FIG. 1B, the wire 110 is shown slightly spaced (in drawing terminology, "exploded" away) from the substrate, rather than having been embedded (countersunk) in or adhesively placed (stuck to) on the surface of the substrate.

The antenna wire 110 may be mounted in the form of a flat coil, having two ends portions 110a and 110b. The ends portions 110a and 110b of the antenna coil wire 110 are shown extending over (FIG. 1A) and may subsequently be connected, such as by thermal-compression bonding (not shown), to the terminals 108a and 108b of the transponder chip 108, respectively.

Examples of embedding a wire in a substrate, in the form of a flat coil, and a tool for performing the embedding (and a discussion of bonding), may be found in the aforementioned U.S. Pat. No. 6,698,089 (refer, for example, to FIGS. 1, 2, 4, 5, 12 and 13 of the patent). It is known that a coated, self-bonding wire will stick to a synthetic (e.g., plastic) substrate because when vibrated sufficiently to soften (make sticky) the coating and the substrate.

In FIG. 1B, the wire 110 is shown slightly spaced (in drawing terminology, "exploded" away) from the terminals 108a/b of the transponder chip 108, rather than having been bonded thereto, for illustrative clarity. In practice, this is generally the situation—namely, the end portions of the wires span (or bridge), the recess slightly above the terminals to which they will be bonded, in a subsequent step. Also illustrated in FIG. 1B is a "generic" bond head, poised to move down (see arrow) onto the wire 110b to bond it to the terminal 108b. The bond head 118 is omitted from the view in FIG. 1A, for illustrative clarity.

The interconnection process can be inner lead bonding (diamond tool), thermal compression bonding (thermode), ultrasonic bonding, laser bonding, soldering, ColdHeat soldering (Athalite) or conductive gluing.

As best viewed in FIG. 1A, in case the antenna wire 110 needs to cross over itself, such as is illustrated in the dashed-line circled area "c" of the antenna coil, it is evident that the wire should typically be an insulated wire, generally comprising a metallic core and an insulation (typically a polymer) coating. Generally, it is the polymer coating that facilitates the wire to be "adhesively placed" on (stuck to) a plastic substrate layer. (It is not always the case that the wire needs to cross over itself. See, for example, FIG. 4 of U.S. Pat. No. 6,698, 089).

In order to feed the wire conductor back and forth through the ultrasonic wire guide tool, a wire tension/push mechanism (not shown) can be used or by application of compressed air it is possible to regulate the forward and backward movement of the wire conductor by switching the air flow on and off which produces a condition similar to the Venturi effect.

By way of example, the wire conductor can be self-bonding copper wire or partially coated self bonding copper wire, enamel copper wire or partially coated enamel wire, silver coated copper wire, un-insulated wire, aluminum wire, doped copper wire or litz wire.

FIG. 1A herein resembles FIG. 5 of U.S. Pat. No. 6,698, 089 (the '089 patent), which has a similar coil antenna (50) with an initial coil region (51) and a final coil region (52) comparable to the antenna 110 with two end portions 110*a* and 110*b* described herein. In the '089 patent, the coil (50) is arranged on a substrate 55 which comprises a substrate recess (56, compare 106 herein) in the interior region (53) of the coil (50).

In FIG. 5 of the '089 patent, it can be seen that the initial and final coil regions (end portions) of the wires extend across the recess. In FIG. 6 of the '089 patent, it can be seen that the recess extends completely through the substrate. If the antenna is mounted to the substrate prior to the chip being installed in the recess (and the antenna is mounted to the front/top surface/side of the substrate, as shown), due to the fact that the antenna wires are "blocking" entry to the recess from the top/front surface of the substrate, the chip must be installed into the recess from the back (bottom) side of the substrate, as indicated by FIG. 6 of the '089 patent.

FIG. 7 of the '089 patent shows the subsequent (inter) connection of the terminal areas 59 of the chip unit 58 to the initial coil region 51 and to the final coil region 52 by means of a thermode 60 which under the influence of pressure and temperature creates a connection by material closure between the wire conductor 20 and the terminal areas 59, as an overall result of which a card module 64 is formed.

FIG. 1C shows the chip 108, having two terminals 108*a* and 108*b* is disposed in the recess 106 in a substrate (generally designated 104). The chip 108 may be rectangular, having a height dimension "h1" and a width dimension "w1". The chip 108 may measure 5.0 mm by 8.0 mm. The terminals 108*a* and 108*b* may be approximately 1.5 mm wide, and may be generally located just within the left and right (as viewed) side edges of the chip 108. The recess 106 may also be rectangular (having the same shape as the chip), and may be only slightly larger than the chip, such as 0.1 mm greater than the chip in both height and width. The recess 106 may measure 5.1 mm×8.1 mm. Generally, the recess 106 is large enough to receive the chip 108, and securely locate it, so that the chip 108 does not shift position after being disposed in the recess 106.

End portions 110*a* and 110*b* of the antenna wire 110 pass directly over respective terminals 108*a* and 108*b* on the chip 108, and are subsequently bonded thereto, as discussed above. The wire 110 may have a diameter of approximately 0.1 mm. The end portions 110*a* and 110*b* of the antenna wire 110 are spaced a distance "s1" apart from one another. The distance s1 is less than the chip width dimension w1, to ensure that the end portions 110*a* and 110*b* of the antenna wire 110 are positioned over the respective terminals 108*a* and 108*b* of the transponder chip 108.

The dashed lines extending from the top (as viewed) of the end portion 110*a* and the bottom (as viewed) of the end portion 110*b* indicate that the wire 110 continues, forming the antenna coil (see, for example, FIG. 1A). The round dots at the bottom (as viewed) of the end portion 110*a* and the top (as viewed) of the end portion 110*b* indicate that the wire ends (stops, does not continue).

A similar situation, wherein the end portions of the antenna wire spanning (or "bridging") the recess, directly above the chip terminals, is shown in FIGS. 4 and 5 of U.S. Pat. No. 6,698,089 ("089 patent"), incorporated by reference in its entirety herein.

A problem with the technique of mounting the end portions of the antenna wire so that they bridge (span across) the recess for the chip is that if the chip is installed (in the recess) from the front (antenna) side of the substrate it must be installed before the antenna is mounted (consequently, the antenna must be mounted with the chip in place). Else, if it is desired to install the chip after the antenna is mounted, the recess must extend all the way through the substrate (as a "window") and the chip must be installed from the opposite side of the substrate.

It is further discussed in the 089 patent that that a single ultrasonic instrument can be used both for fixation of the wire (mounting the wire on the substrate), and for connection of (bonding) the wire to the terminals of the chip. (column 15, lines 33-36)

The process described above with reference to FIGS. 14 and 15 of the 089 patent also offers the possibility, by appropriate choice of the points of fixation of the wire conductor on the substrate, of guiding the wire conductor away diagonally via the terminal areas, in order to increase the overlap between the wire conductor and the terminal areas. Also, several chips or other elements arranged in series on, or in, a substrate can be connected by means of the wire conductor in the manner represented in FIG. 14. (column 14, lines 39-47)

FIGS. 16 and 17 of the 089 patent show that a chip (132) may be introduced into the recess (114), after fixation of the wire conductor (113) on the surface of the substrate. As is evident, in order to accomplish this, the recess (114) extends fully through the substrate, and the chip is introduced from the opposite side of the substrate. Ends of the wire pass over the recess, generally in alignment with positions corresponding to terminals on the chip. After the chip is installed (FIG. 16), a connecting instrument enables a connection of the wire conductor to the corresponding terminal area. Also, as discussed in the 089 patent, in order to enable a positioning of the chip that is suitable for contacting of the wire conductor, the chip (132) is equipped on its contact side with a bridge-tape alignment aids (135), arranged adjacent to a terminal area, which provide for correct relative positioning via guide bevels (136).

BRIEF DESCRIPTION (SUMMARY) OF THE INVENTION

It is a general object of an embodiment of the invention to provide improved techniques for fabricating inlays with transponders and, more particularly, to preparing end portions of an antenna wire mounted to the substrate for connection to terminals of the transponder including, but not limited to, (i) permitting a transponder chip to be positioned in a recess in a front side of a substrate after the antenna wire is mounted to the front surface of the substrate, and (ii) improving the quality of the interconnection and the long term reliability of the bonds.

These objects may generally achieved by (i) mounting the antenna wire to the substrate so that end portions of the wire are spaced far enough apart so that a transponder chip may subsequently be positioned therebetween (installed onto or into the substrate, past the spaced-apart end portions of the antenna wire), then:

moving (repositioning) the end portions of the antenna wire to be over the terminals of the transponder chip, then bonding them thereto moving the chip or the substrate so that the chip's terminals are under the wires, then bonding them thereto and (ii) by removing insulation from the end portions of the wire, such as with a laser, prior to bonding (and typically prior to installing the transponder chip), which may be facilitated by providing slots under the end portion of the wire.

According to an embodiment of the invention, a method of connecting an antenna wire (210, 260, 310, 410, 510, 610, 710) to a transponder chip (208, 250, 308, 408, 508, 608, 708) comprises mounting the antenna wire to a surface of a substrate (204, 254, 304, 404, 504, 604, 704), and is characterized by: leaving end portions (210a/b, 260a/b, 310a/b, 410a/b, 510a/b, 610a/b, 710a/b) of the antenna wire un-mounted as free-standing loops which are spaced far enough apart for a transponder chip (208, 250, 308, 408, 508, 608, 708) to be positioned therebetween. The end portions may comprise wire bridges, jump loops, or flat loops. The transponder chip may be positioned between the free-standing loops. The end portions (free-standing loops) may be re-positioned to be over the terminals (208a/b, 258a/b, 308a/b, 408a/b, 508a/b, 608a/b, 708a/b) of the transponder chip for bonding, and subsequently bonded to corresponding terminals of the transponder chip. The transponder chip and/or the substrate may be moved so that the transponder chip's terminals are under the end portions of the wire for bonding. Insulation may be removed from the end portions of the wire prior to bonding. Slots may be provided in the substrate, under a portion of the free-standing loops whereat the insulation is removed.

According to an embodiment of the invention, a transponder inlay (200, 250, 300, 400, 500, 600, 700) comprises a substrate (204, 254, 304, 404, 504, 604, 704), and an antenna wire (210, 260, 310, 410, 510, 610, 710) mounted to a surface of the substrate, and is characterized by: end portions (210a/b, 260a/b, 310a/b, 410a/b, 510a/b, 610a/b, 710a/b) of the antenna wire are un-mounted free-standing loops which are spaced far enough apart for a transponder chip (208, 250, 308, 408, 508, 608, 708) to be positioned therebetween. The end portions may comprise wire bridges, jump loops, or flat loops. Slots may be provided in the substrate, under a portion of the free-standing loops whereat insulation may be removed. A recess may be provided in the surface of the substrate and the end portions of the antenna wire may span the recess (206) in the surface of the substrate. Or, the end portions of the antenna wire may be disposed adjacent the recess in the surface of the substrate. The substrate may be a multi-layer substrate.

Other objects, features and advantages of the invention will become apparent in light of the following description thereof.

BRIEF DESCRIPTION OF THE DRAWINGS

Reference will be made in detail to embodiments of the disclosure, examples of which may be illustrated in the accompanying drawing figures (FIGs). The figures are intended to be illustrative, not limiting. Although the invention is generally described in the context of these embodiments, it should be understood that it is not intended to limit the invention to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

Figure 1A:
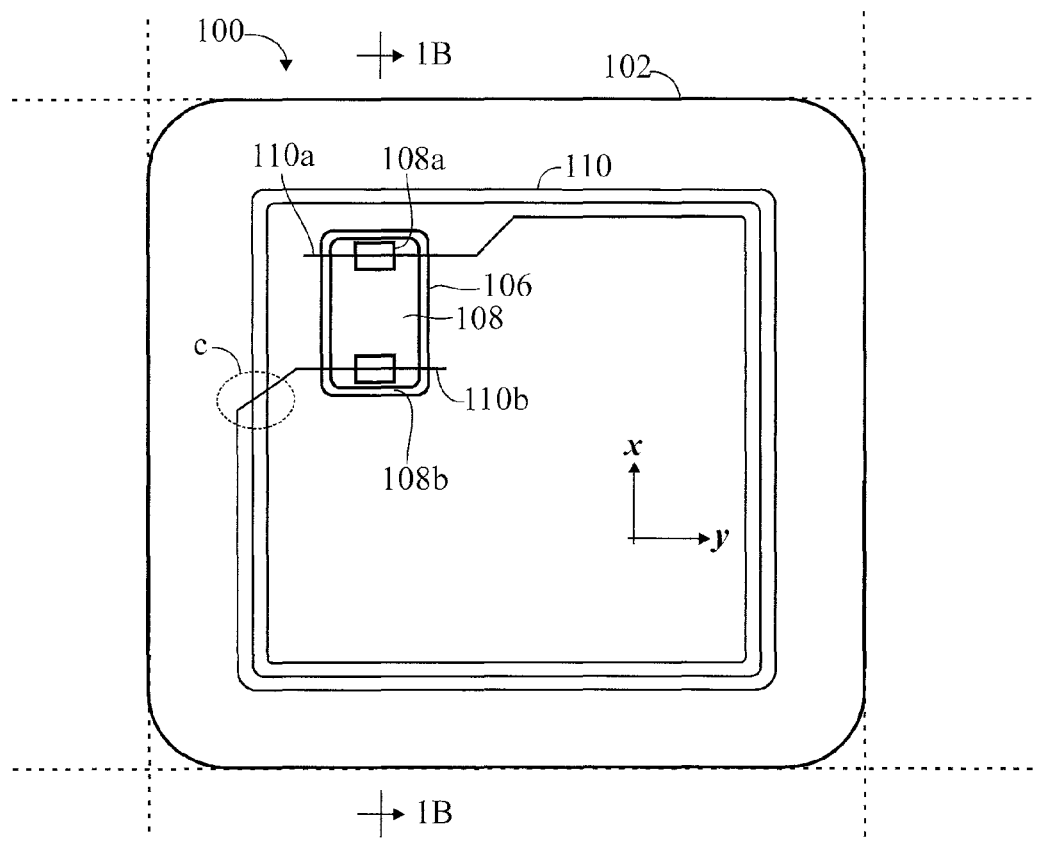

If shading or cross-hatching is used, it is intended to be of use in distinguishing one element from another (such as a cross-hatched element from a neighboring un-shaded element). It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199a, 199b, 199c, etc. Such relationships, if any, between similar elements in the same or different figures will become apparent throughout the specification, including, if applicable, in the claims and abstract.

FIG. 1A is a top view of a transponder site, according to the prior art.

Figure 1B:
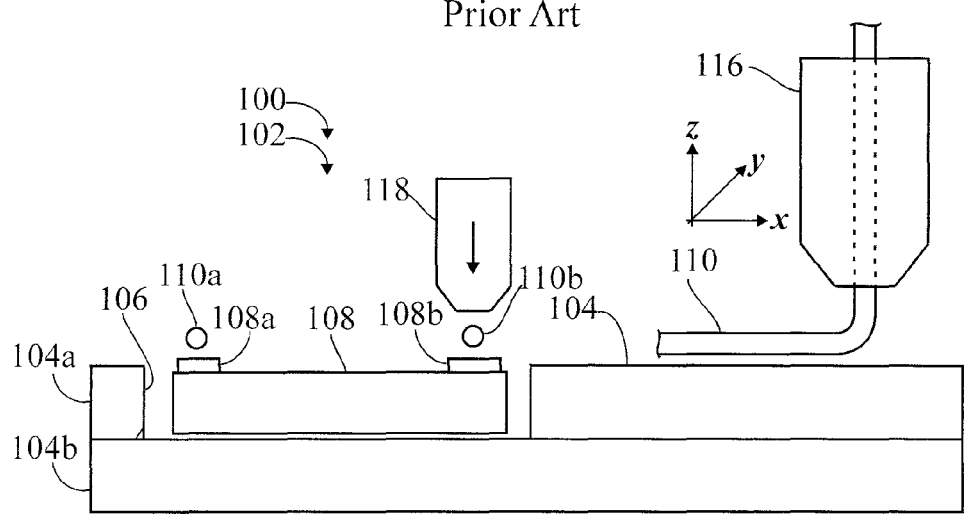

FIG. 1B is a side, cross-sectional view, partially exploded, of a wire being mounted to the substrate of FIG. 1A (and bonded to the terminals of the chip), according to the prior art.

Figure 1C:
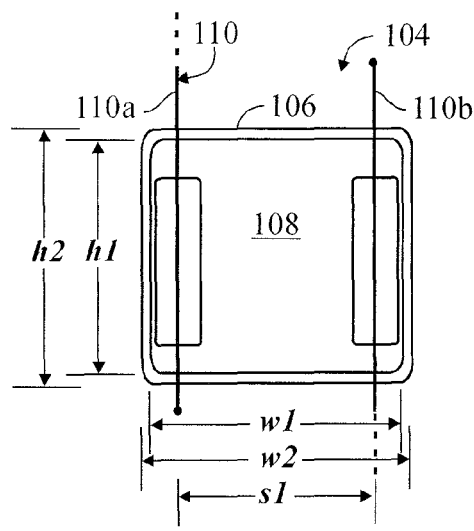

FIG. 1C is a top view of a portion of a transponder site, showing transponder chip mounted in a recess, and end portions of an antenna wire bonded to respective terminals of the transponder chip, according to the prior art.

Figure 2C:
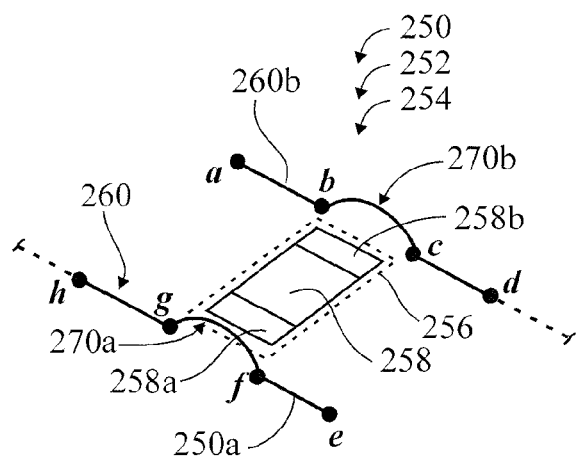
Figure 2A:
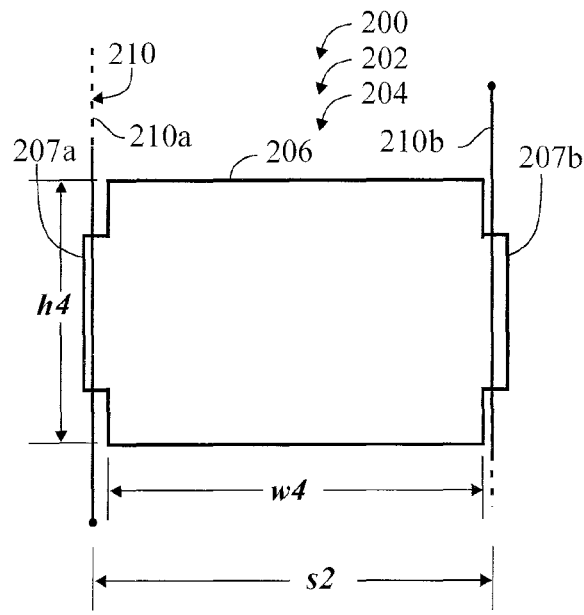

FIG. 2A is a top view of a portion of a transponder site, showing a recess and an antenna wire having end portions spanning (bridging) the recess, according to an embodiment of the invention.

Figure 2B:
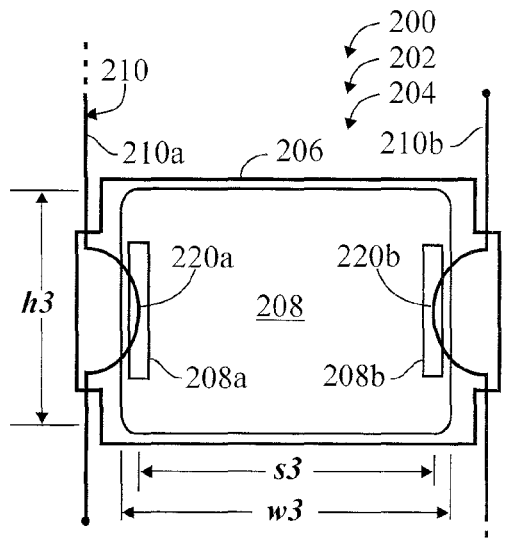

FIG. 2B is a top view of a portion of a transponder site of FIG. 2A, showing a transponder chip mounted in the recess, and the end portions of the antenna wire repositioned for bonding to respective terminals of the transponder chip.

FIG. 2C is a perspective top view of a transponder site, showing a recess and an antenna wire having end portions looped adjacent a recess for a transponder chip, according to an embodiment of the invention.

FIGS. 3A-3E are top views of a recess in a substrate, and a method of connecting an antenna mounted on the substrate to a chip disposed in the recess, according to an embodiment of the invention.

FIGS. 4A-4E are cross-sectional views of a recess in a substrate, and a method of connecting an antenna mounted on the substrate to a chip disposed in the recess, according to an embodiment of the invention.

Figure 5A:
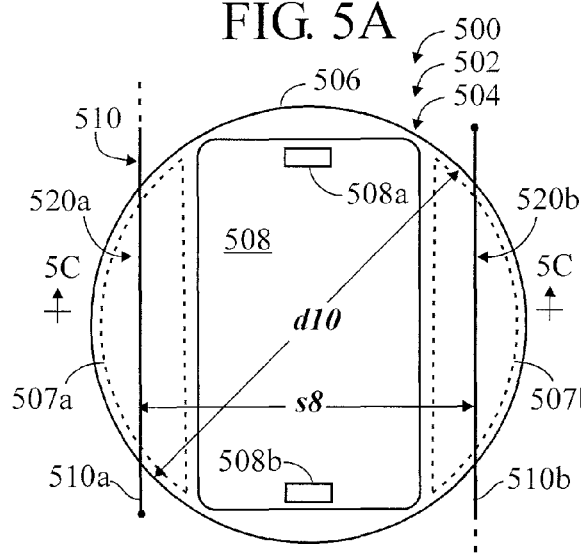

FIG. 5A is a top view of a portion of a transponder site, showing a transponder chip installed in a recess, and end portions of an antenna wire bridging the recess, according to an embodiment of the invention.

Figure 5B:
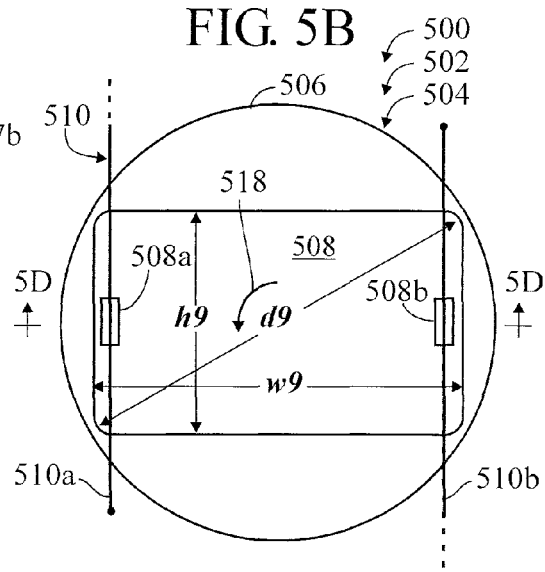

FIG. 5B is a top view of a portion of a transponder site of FIG. 5A, showing the transponder chip repositioned in the recess, so that the end portions of the antenna wire may be bonded to respective terminals of the transponder chip.

Figure 5C:
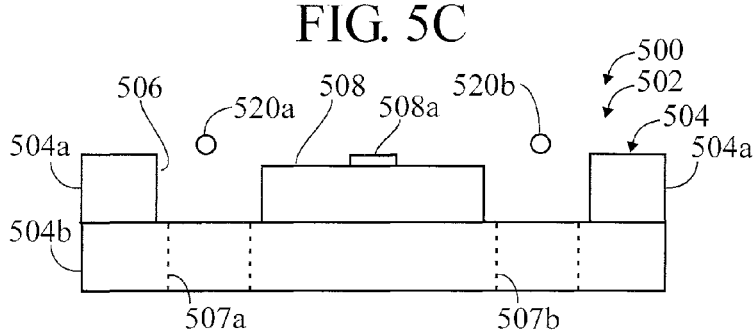

FIG. 5C is a cross-sectional view of the portion of the transponder site shown in FIG. 5A, taken on a line 5C-5C through FIG. 5A.

Figure 5D:
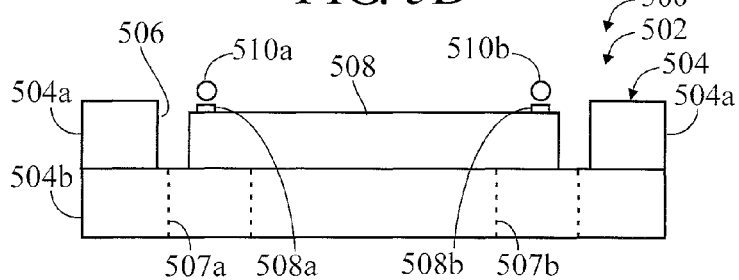

FIG. 5D is a cross-sectional view, partially exploded, of the portion of the transponder site shown in FIG. 5B, taken on a line 5D-5D through FIG. 5B.

Figure 6A:
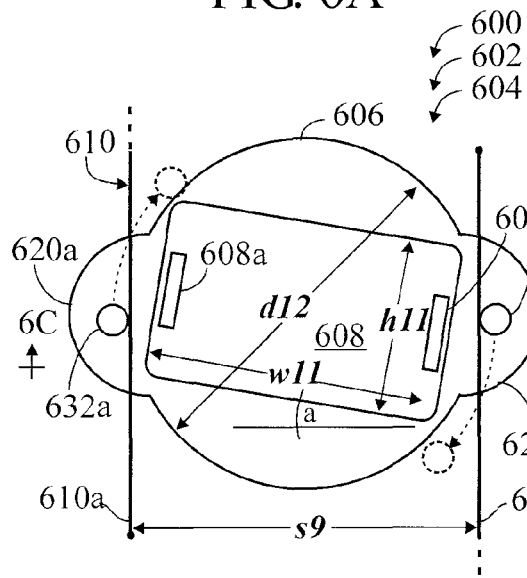

FIG. 6A is a top view of a portion of a transponder site, showing a transponder chip installed in a recess, and end portions of an antenna wire bridging the recess, according to an embodiment of the invention.

Figure 6B:
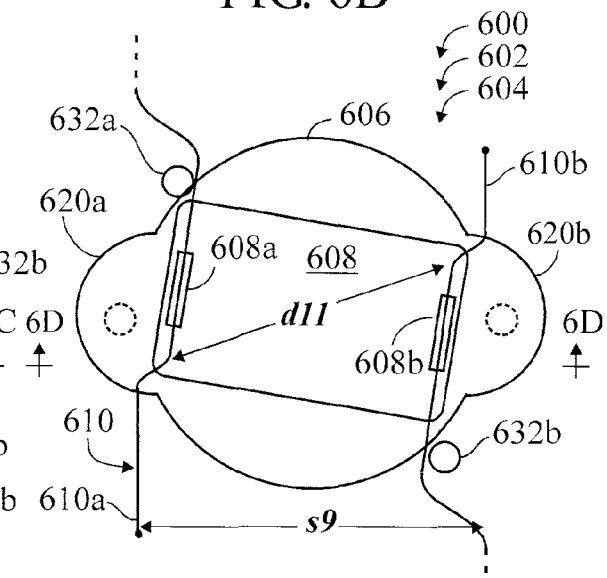

FIG. 6B is a top view of a portion of a transponder site of FIG. 6A, showing the end portions of the antenna having been repositioned, so that the end portions of the antenna wire may be bonded to respective terminals of the transponder chip.

Figure 6C:
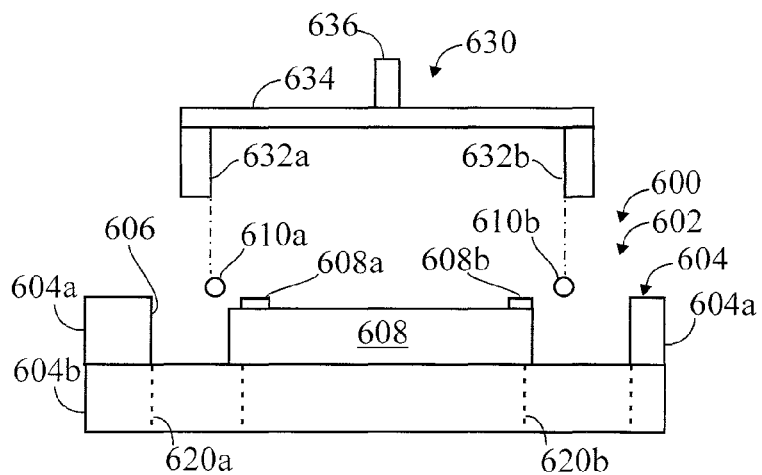

FIG. 6C is a cross-sectional view, partially exploded, of the portion of the transponder site shown in FIG. 6A, taken on a line 6C-6C through FIG. 6A.

Figure 6D:
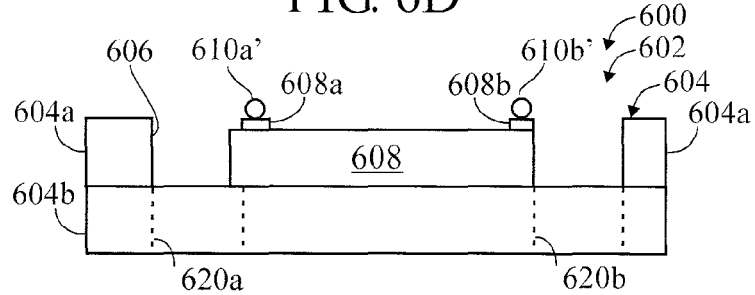

FIG. 6D is a cross-sectional view of the portion of the transponder site shown in FIG. 6B, taken on a line 6D-6D through FIG. 6B.

FIG. 7A is a top view of a portion of a transponder inlay (or transponder site of a transponder inlay) showing wires passing over a recess (as flat loops) and transponder chip inserted between the spaced-apart flat loops, according to an embodiment of the invention.

FIG. 7B is a top view of a portion of a transponder site of FIG. 7A, showing the transponder chip having been rotated, so that the flat loop end portions of the antenna wire are over terminals of the transponder chip, and may be bonded to respective terminals of the transponder chip. The transponder chip may be dropped (lowered) into the recess prior to bonding the end portions of the wire to the terminals of the transponder chip.

FIG. 7C is a schematic illustration of forming flat loops at end portions of an antenna wire which is mounted to (embedded in or place on) a substrate, illustrating an embodiment of the invention.

Figure 7D:
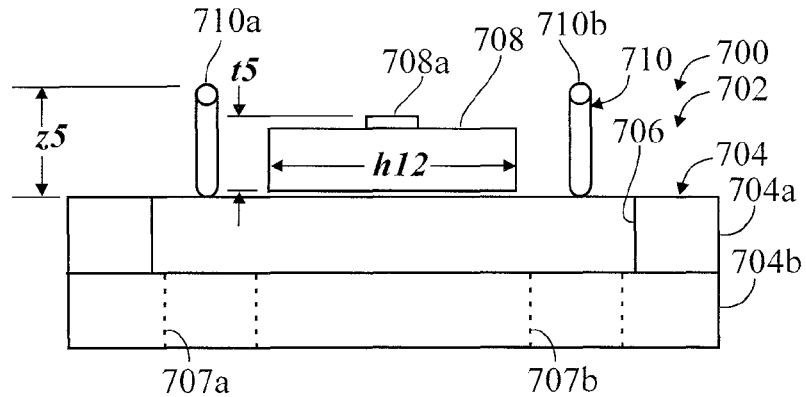

FIG. 7D is a cross-sectional view of the transponder site shown in FIG. 7A, taken on a line 7A-7A through FIG. 7A, showing the transponder chip initially having been positioned between the flat loops, prior to being rotated, and prior to being installed in the recess.

Figure 7E:
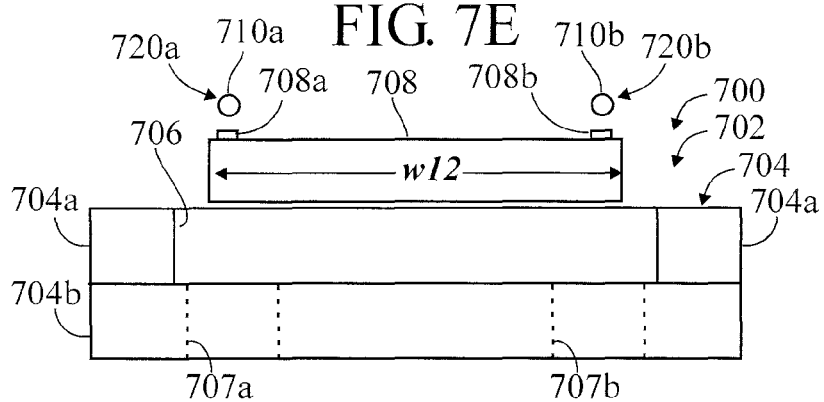

FIG. 7E is a cross-sectional view of the transponder site shown in FIG. 7B, taken on the line 7E-7E through FIG. 7B, showing the transponder chip having been rotated so that its terminals are disposed under the flat loops, and prior to being installed in the recess.

Figure 7F:
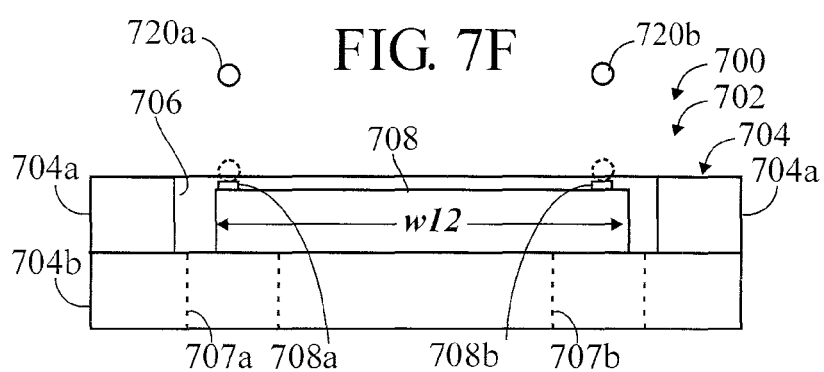

FIG. 7F is a cross-sectional view of the transponder site shown in FIG. 7B, taken on a line 7E-7E through FIG. 7B, showing the transponder chip having been rotated so that its terminals are disposed under the flat loops, with the transponder chip installed in the recess.

Figure 7G:
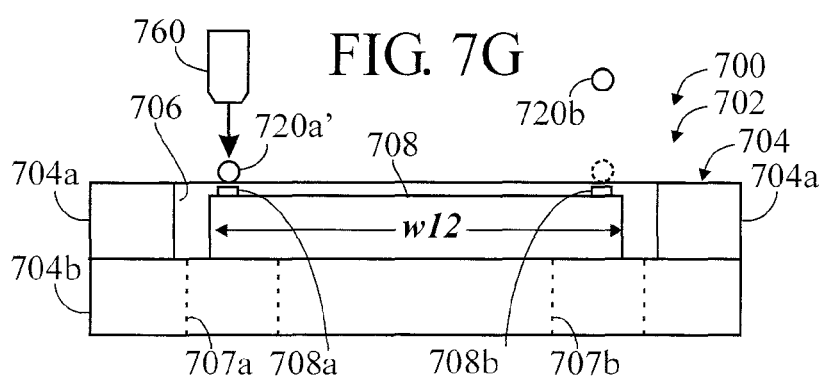

FIG. 7G is a cross-sectional view of the transponder site shown in FIG. 7B, taken on a line 7E-7E through FIG. 7B, showing the transponder chip having been rotated so that its terminals are disposed under the flat loops, with the transponder chip installed in the recess, and the flat loops being bonded to the terminals of the transponder chip.

Figure 8A:
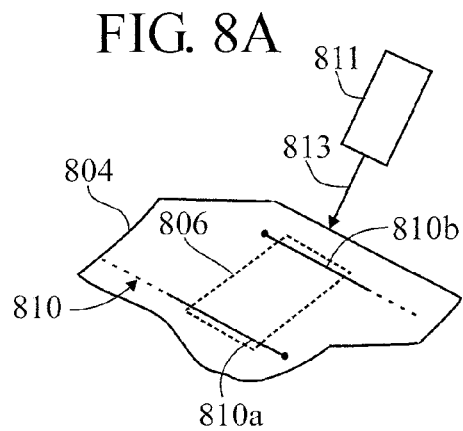

FIG. 8A is a perspective view of a technique for removing insulation from wire bridges, according to an aspect of the invention.

Figure 8B:
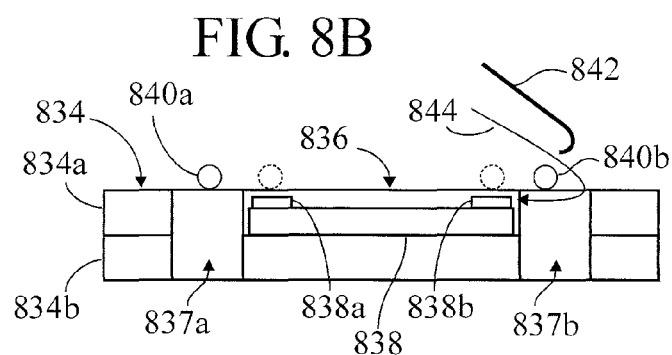

FIG. 8B is a cross-sectional view of an inlay with a chip with wire bridges passing over slots adjacent a recess for a transponder chip and being manipulated (repositioned) over terminals of a transponder chip, according to an embodiment of the invention.

Figure 8C:
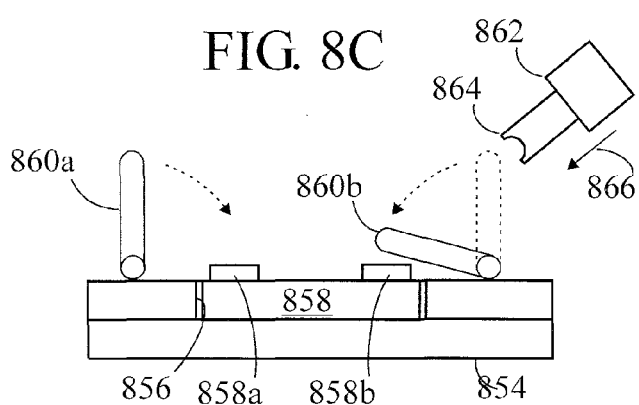
Figure 8D:
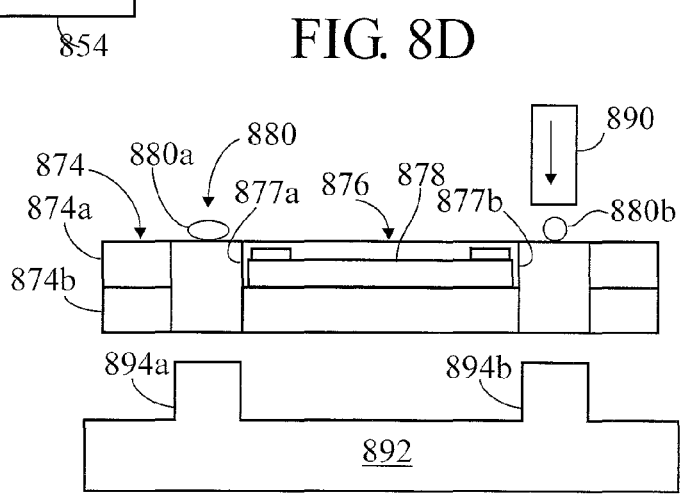

FIG. 8C is a cross-sectional view of an inlay with a chip and jump loops disposed adjacent a recess for a transponder chip and being manipulated (repositioned) over a terminal of a transponder chip, according to an embodiment of the invention FIG. 8D is a cross-sectional view of an inlay with a chip with wire bridges passing over slots and being flattened, according to an embodiment of the invention.

Figure 9:
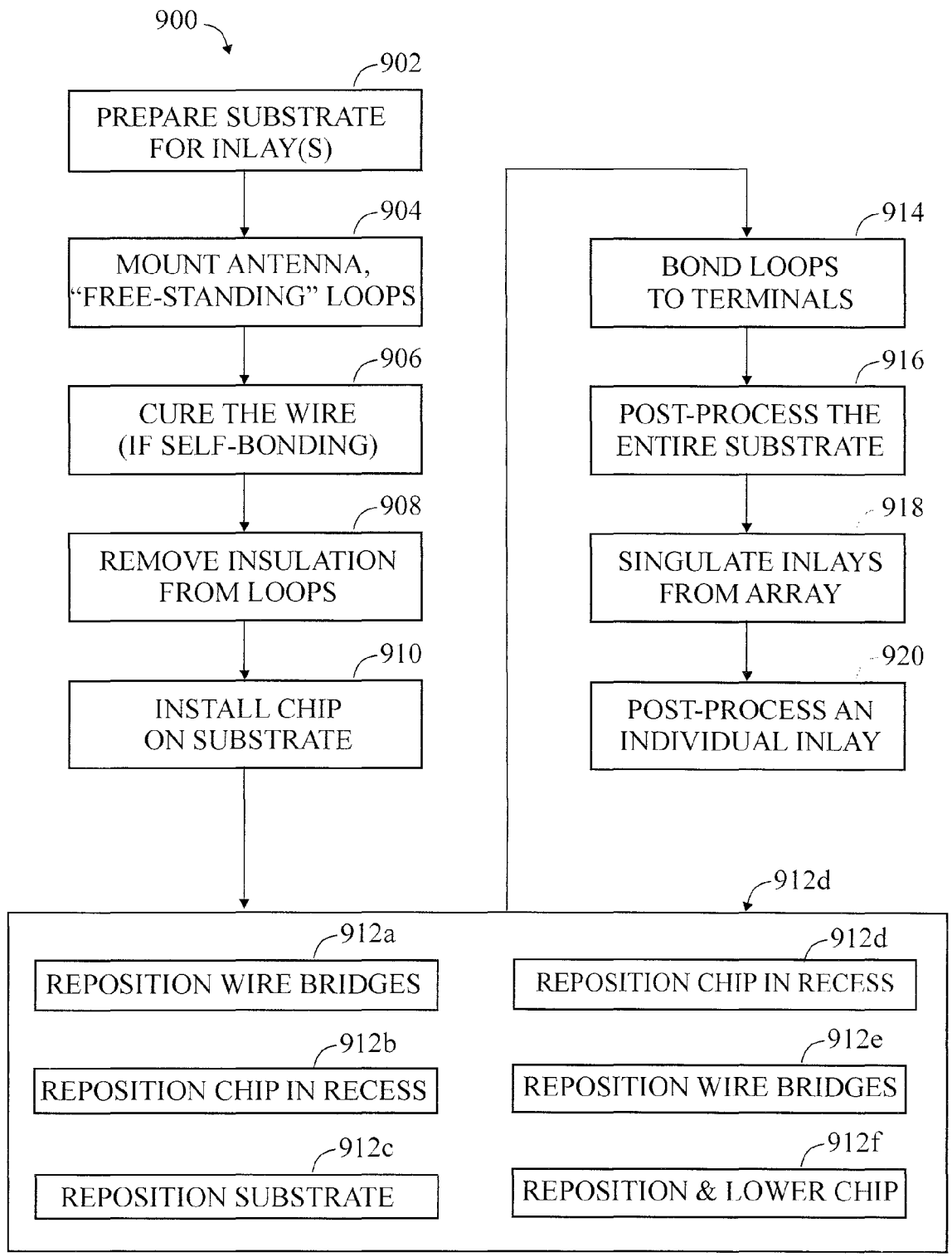

FIG. 9 is a diagram showing a manufacturing flow, according to an embodiment of the invention.

DETAILED DESCRIPTION OF THE INVENTION

Various "embodiments" of the invention will be discussed. An embodiment is an example or implementation of one or more aspects of the invention(s). Although various features of the invention may be described in the context of a single embodiment, the features may also be provided separately or in any suitable combination with one another.

It should be understood that the phraseology and terminology employed herein is not to be construed as limiting, and is for descriptive purposes only.

As used herein, an "inlay" is a generally planar substrate (or sheet), which may include several (a plurality of) distinct "transponder areas", arranged for example in a 3×6 array on the inlay sheet. The inlay sheet may have one or more (multiple) layers. A "transponder" may be fabricated in each "transponder area". Each "transponder" may include an antenna which is mounted to a surface (such as a top layer) of the substrate, and a "transponder chip" which is installed at a "transponder chip site" (or "site for the transponder chip") on the substrate. The antenna is typically in the form of a flat coil having two ends which are connected to bond pads (terminals) on the "transponder chip". The "transponder chip" may be an individual integrated circuit (IC) chip, or a chip module (such as a chip mounted to a small substrate or a carrier). The "transponder chip site" of the "transponder" ("transponder area" of the "inlay sheet") may comprise a recess (or window, or opening) extending through the top and one or more underlying layers of the substrate, such that the "transponder chip" can be installed in the recess, submerged below the surface of the "inlay sheet" and supported by an underlying layer of the substrate. A window may extend completely through the inlay sheet so that a transponder chip or chip module may be installed from an opposite (from the antenna) side of the inlay sheet. The following terminology may be used herein to describe embodiments of the invention.

When the term "inlay" is used herein, it may be taken to include any generally planar substrate, typically credit-card sized, made of a synthetic material or a coated non-synthetic material, such as paper. An inlay has an array of transponder sites, the format can be 3×6 for a card manufacturer. An inlay will typically comprise a (planar) substrate, a transponder (or RFID) chip, and an antenna (typically a flat coil of wire, having two ends).

When the term "substrate" is used herein, it should be taken to include non-conductive material, synthetic material, paper but also material coated with ferrite to create a Faraday cage or material used on stealth aircraft (to absorb or reflect electromagnetic waves). The substrate may be a multi-layer substrate (such as shown in FIG. 1B).

A suitable material for any of the substrates discussed herein is TESLIN, TYVEK, PC, PVC, PE, PET, PETE, Paper, C-FLEX, Paper or Cotton/Noil etc. in sheet format or endless roll (web) can be coated with adhesive film to protect the first chip and to support the process for manufacturing the inlay at the secure printing office. The substrate can also have special markings such as luminous threads, water marks, microscopic filings and optical polymer memory for additional security. A typical thickness for the substrate for passport inlays can be between 360 and 750 microns.

PVC short for polyvinyl chloride, (IUPAC Polychloroethene). PVC is a widely used thermoplastic polymer. It can be made softer and more flexible by the addition of plasticizers, the most widely used being phthalates.

PET short for Polyethylene terephthalate (also know as PET, PETE or the obsolete PETP or PET-P). PET is a thermoplastic polymer resin of the polyester family that produced by the chemical industry and is used in synthetic fibres; beverage, food and other liquid containers; thermoforming applications; and engineering resins often in combination with glass fiber. It is one of the most important raw materials used in man-made fibres.

PETE see PET.

Teslin™ Teslin is a synthetic printing media, manufactured by PPG Industries. Teslin is a waterproof synthetic material that works well with an Inkjet printer, Laser printer, or Thermal printer. Teslin is also single-layer, uncoated film, and extremely strong. In fact, the strength of the lamination peel of a Teslin sheet is 2-4 times stronger than other coated synthetic and coated papers. Teslin comes in the sizes of 7 mil to 18 ml, though only sizes 10 mil and 14 mil are sized at 8.5" by 11", for printing with most consumer printers. Also available are perforated versions of Teslin, specifically, 2up, 6up, and 8up.

Tyvek™ Tyvek is a brand of spunbonded olefin, a synthetic material made of high-density polyethylene fibers; the name is a registered trademark of the DuPont Company. The material is very strong; it is difficult to tear but can easily be cut with scissors or any other sharp object. Water vapor can pass through Tyvek, but not liquid water, so the material lends itself to a variety of applications: medical packaging, envelopes, car covers, air and water intrusion barriers (housewrap) under house siding, labels, wristbands, mycology, and graphics.

When the term "transponder" is used herein, it may be taken to include any chip suitable for use in an inlay, such as an RFID chip.

When the term "chip" is used herein, it may be taken to include a chip module, or a chip unit. Generally, as used herein, "chip" is intended to mean RFID or transponder chip. Also, where applicable, "chip" may refer to a die, chip module or carrier or "strap".

Regarding metalized bumps on chips, normally chips (also referred to as "dice", plural of "die") have aluminum pads 100×100 microns in dimension. Gold bumps may be sputtered or plated onto the aluminum pads and rise 25 microns above the pads. Enhanced pads or so-called "mega bumps" can be large and can be mounted over the active structure of a die.

When the term "wire" is used herein, it may be taken to include any elongate means for conveying or radiating signals, such as metallic wire (such as gold, aluminium, copper, silver), of any profile (such as round or rectangular), either bare, coated or colour coated, as well as optical fibers.

When the term "antenna" is used herein, it may be taken to include a simple coil antenna comprising wire having a number of turns, and two ends, a dipole antenna having two wire segments with two inner ends, or any other antenna configuration suitable for connection to a chip or chip module in an inlay.

When the term "mounting" is used herein (in conjunction with wire) it may be taken to include embedding or countersinking the wire into a surface of the inlay substrate and/or adhesively placing (bonding or sticking) the wire to the surface of the substrate. In some contexts, the term "embedding" may be taken to include adhesively placing, if appropriate in the context (such as when describing mounting a self-bonding wire)—in other words, "embedding" may sometimes be used to mean "mounting" (which includes both "embedding" and "adhesively placing").

When the term "bonding" is used herein, it may be taken to include any means of interconnecting (or simply "connecting"), both physically and electrically, a wire, or an end of the wire, or an end portion of the wire, to a terminal or connection pad on a chip or chip module. (Bonding typically comprises a kind of welding, but can include adhesively bonding and soldering.) The interconnection process can for example be inner lead bonding (heated diamond tool), thermal compression bonding (thermode), ultrasonic bonding or laser welding.

Generally, as used herein describing embodiments of the invention, the "transponder chip" is an electronic component comprising (having at least) two terminals, which may be a single chip, or a module comprising (having at least) a chip. Generally, the two terminals of the chip or module are interconnected with corresponding two end portions of the antenna wire which is mounted to a top surface of a substrate, which may be a multilayer substrate.

Generally, as used herein describing embodiments of the invention, the transponder chip is disposed in a "recess" or "cavity" which is an opening extending at least partially through the substrate. A "window" is generally an opening that may extend fully through the substrate. A "slot" is another opening (or hole) extending through the substrate next to a recess, cavity or window. In some embodiments, any of recess, cavity, window, or slot (and combinations thereof) may be used, and when the term "recess" is used, it should be understood to include all the variations and combinations, as may be appropriate from the context.

As used herein, a "recess" is generally (and usually) an opening extending only partially through a (typically) multilayer substrate (the recess may extend completely through top layers only), as may be exemplified by the recess 106 (FIG. 1B). The term "cavity" may be used interchangeably with "recess". A "window" is generally (and usually) an opening extending completely through a substrate (whether or not multilayer), as may be exemplified by the opening 56 in FIG. 6 of U.S. Pat. No. 6,698,089.

Some embodiments of the invention may generally involve pre-positioning ends of an antenna wire adjacent a transponder site in preparation for connecting (bonding) to a transponder chip. When the term "pre-positioning" is used herein, it should be taken to include the location whereat the end portions of the antenna are located, in relation to the site for the transponder chip, and any form or shape imparted to the end portion of the wire.

When the term "adjacent" is used herein, it should be taken to mean other than (not) within the area of the site for the transponder chip, but rather next to the site for the transponder chip. As a result of the end portions of the antenna wire being pre-positioned adjacent the site for the transponder chip, rather than within (or over) the site for the transponder chip. Thus, the transponder chip can be installed at (or removed from) the site for the transponder chip unimpeded by the end portions of the antenna wire, since the end portions of the antenna wire are pre-positioned to not be over the site for the transponder, including installing the transponder chip from the same side of the substrate as the antenna.

Inasmuch as the pre-positioned end portions of the antenna wire may ultimately be re-positioned to be over terminals of the transponder chip, for interconnection (such as by bonding) thereto, the end portions of the antenna wire can be as close as possible to the site for the transponder chip without impairing (or becoming damaged by) subsequent installation of the transponder chip. For example, the end portions of the antenna wire may be 0.5-3.0 mm, such as 1.0-2.0 mm away from a transponder area (or recess for the transponder chip).

In some embodiments, as described hereinbelow, rather than moving the pre-positioned end portions of the antenna wire to be over the terminals of the transponder chip, the transponder chip is moved so that its terminals are under the pre-positioned end portions of the antenna wire for bonding thereto. Generally, either the transponder chip is moved relative to the substrate (and wire, since the wire is mostly mounted to the substrate), or the transponder chip may be held in a fixed position and the substrate is moved. In some embodiments, the transponder chip is rotated, after having been positioning in the recess or positioned just above the surface of the substrate, so that its terminals are under the pre-positioned end portions of the antenna wire for bonding thereto. If not already in the recess, the transponder chip may then be lowered (dropped, sunk) into the recess.

A conventional method to produce an inlay is to embed insulated wire into a synthetic material (or a coated substrate), form an antenna coil on the substrate with a number of turns and interconnect the wire ends of the antenna to a transponder chip (or chip module). The interconnection of the antenna wire to the chip module is non-trivial, and it can be beneficial that the transponder chip (or chip module) can be installed on a substrate to which an antenna coil has already been mounted.

"Wire Bridges"

FIGS. 2A-2B illustrate an embodiment of the invention which utilizes a "wire bridge" method, and in which a chip (or chip module) and the antenna are positioned on a common substrate, whereby the antenna resides on the top side (front surface) of the substrate and the chip may be inserted from either the top side or the bottom (opposite) side of the substrate.

Generally, the substrate has a rectangular recess (or cavity) to accommodate a rectangular transponder chip (or chip module) and end portions of the antenna wire pass over (span, bridge) the recess, or slots adjacent to the recess. The antenna is mounted to the front (top) side (surface) of the substrate, and the chip can be inserted into a recess extending only partway through the substrate from the front surface thereof, after the antenna is mounted to the front surface of the substrate. Or, the chip can be inserted in to a cavity extending all the way through the substrate, from the opposite back (bottom) side (surface) of the substrate.

Generally, in this embodiment, rather than the end portions of the wire passing directly over the terminals of the transponder chip, the end portions of the antenna wire are located adjacent to (next to, rather than directly over) the terminal areas of the chip, and thus initially forming a wire bridge on each side of the chip. After installing the transponder chip (or chip module) in the recess, the wire bridges can be re-positioned to be over terminals of the transponder chip, and bonded thereto. The repositioned wire bridges may be referred to as "planar loops".

FIGS. 2A and 2B show a transponder site 202 (compare 102) on a substrate 204 (compare 104) which may be a portion of an overall inlay sheet 200 (compare 100), whereby a recess 206 (compare 106) is provided for a transponder chip 208 (compare 108). The transponder chip 208 may be disposed in the recess 206 after the antenna 210 (compare 110) is mounted to (embedded in or adhesively place on) the substrate 204.

Generally, in the embodiments disclosed herein, the recess (in this embodiment, 206; in another embodiment, 306) represents a "transponder chip site", or site (area, location) where a transponder chip will be mounted on the substrate, whether or not there is a recess. Such a transponder chip site constitutes a designated area of the substrate whereat the transponder is intended to be located. Generally, the transponder chip site will be a recess which is formed in the substrate, such as an opening in a top layer(s) of a multi-layer substrate. Also, the terminals (in this embodiment, 208a/b; in another embodiment, 308a/b; also 408a/b) represent "terminal areas" which are areas whereat the terminals of the transponder chip will be, after it is mounted and, as such, have a predetermined relationship to the transponder chip site (or recess).

The chip 208, has two terminals 208a and 208b (compare 108a and 108b), and may be rectangular, having a height dimension "h3" and a width dimension "w3". The chip 208 may measure 5.0 mm by 8.0 mm (the chip 208 may have the same dimensions as the chip 108).

The recess 106 may also be rectangular (generally, the same shape as the chip), having a height dimension "h4" and a width dimension "w4". The height dimension h3 of the recess may be only slightly larger, such as 0.1 mm greater, than the height dimension h2 of the chip. The width dimension w4 of the recess may be only slightly larger, such as 0.1 mm greater, than the width dimension w3 of the chip. This is generally the same as the situation illustrated in FIG. 1C.

End portions 210a and 210b of the antenna wire 210 do not pass directly over respective terminals 208a and 208b of the chip 208. (The end portions 210a and 210b of the antenna wire 210 do not pass over an area which will be occupied by the chip 208.) Rather, the two end portions 210a and 210b of the antenna wire span (bridge) the recess 206, and are spaced apart from one another a distance (s2) which is greater than the width (w3) of the chip 208, so that the chip 208 can be inserted into the recess 206 from the same side of the substrate 204 as the antenna, past the end portions 210a and 210b of the wires, after the antenna has been mounted (embedded in or adhesively placed on) to the substrate 204. Subsequently, as described in greater detail hereinbelow, the end portions 210 and 210b of the wire 210 are manipulated (re-positioned, moved, stretched) so as to be over the terminals 208a and 208b, and are bonded thereto.

Portions of the end portions 210a and 210b of the antenna wire 210 which pass over the recess 206 or slots 207a and 207b and may be referred to as "wire bridges". When re-positioned to be over the terminals 208a and 208b of the chip 208, the wire bridges may be referred to as "planar loops" 220a and 220b. Although shown in FIG. 2A as passing straight over the recess (or slot), the end portions of the wire may make a bowed (non-straight, such as curved) transit over the recess (or slot).

This method of re-positioning the wire conductor may requires a tool (described hereinbelow) to form or grip the wires and re-position them above the terminals of the transponder chip, in preparation for interconnection (bonding) with the terminals of the transponder chip. Such a tool is well known, and may be referred to in the industry as a "wire gripper". The tool can generally be in the form of an elongate member terminating in a hook, like a crochet needle, having a diameter approximately equal to the diameter of the wire being gripped (and moved).

The dashed lines extending from the top (as viewed) of the end portion 210a and the bottom (as viewed) of the end portion 210b indicate that the wire continues, forming the antenna coil (see FIG. 1A). The round dots at the bottom (as viewed) of the end portion 210a and the top (as viewed) of the end portion 210b indicate that the wire ends (stops, does not continue).

In this embodiment, slots 207a and 207b are provided on the left and right (as viewed) side edges of the recess 206. The slots 207a and 207b may extend fully through the substrate 204, while the recess 206 may extend only partially through the substrate 204. The slots 207a and 207b are shown as being shorter (less height, in the vertical direction as illustrated) than the side edges of the recess 206. The slots 207a and 207b may be considered to be "widthwise extensions" of the recess 206 and, as such, may be considered simply to be side edge portions of the recess 206. In this aspect, the slots 207a and 207b extending from the side edges of the recess 206 could be the full height dimension (h4) of the recess, rather than being shorter, as illustrated. The slots 207a and 207b are shown disposed adjacent opposite sides of the recess 206, as extensions thereof. The slots 207a and 207b may otherwise be separate from the recess 206, adjacent and spaced from the side edges thereof.

The slots 207a and 207b (whether or not considered to be a part of the recess, per se) provide an area under the wire bridge spanning the slot which is deeper than the recess 206, such as fully through the substrate, to allow a hook or wire gripper to pass easily under the wires. The chip resides in the recess, but the slots 207a and 207b provide "windows" under the "wire bridges" which allows the end portions of the wire to be gripped more easily for positioning purposes, either from the top or bottom of the substrate, or both.

Some advantages to having the slots 207a and 207b include that they can provide an opportunity to install an optical mechanism in conjunction with a UV laser for insulation removal (removing coating from the wire bridges, prior to bonding). In use, one would have an insulation removal station in the transponder line and the laser can remove the insulation from all sides of the wire without restrictions. It also avoids any damaging or markings to the substrate. A mirrored surface under the slots can also be used, in conjunction with a vision system, to ensure that the insulation is completely removed. Also, during the bonding process, slots under the positioned chip and wire can be advantageous as one can support the chip with a well-defined surface during bonding. Insulation removal is discussed in greater detail hereinbelow.

As illustrated in FIG. 2A, prior to installing (placing, locating, disposing) the chip 208 in the recess 206, an antenna is formed by passing a wire conductor 210 over the slotted cavity area 207a, forming an antenna, and finally passing the wire conductor over the second slotted cavity 207b. The wire conductor on each side of the chip cavity or chip recess forms wire bridges. The wire bridges are mounted into or onto the substrate, and therefore are in a fixed position.

Generally, in any of the embodiments described herein, it is also possible to remove the insulation before proceeding to the next step in the process, such as prior to bonding the end portions of the antenna wire (wire bridges) to the terminals of the transponder chip (or chip module).

FIG. 2B illustrates the placement of a chip 208 into the recess 206, and the subsequent re-positioning of the wire bridges 210a and 210b over the terminal areas 208a and 208b of the chip 208 for subsequent bonding thereto (bonding is not shown, it is known, see bond head 118, FIG. 1).

If the recess 206 extends only partially through the substrate 204 (compare recess 106, FIG. 1), the chip 208 can be placed in the cavity, after the antenna is mounted, with the wire bridges in place, since the wire bridges are spaced apart from one another wider than the width dimension w3 of the chip 208. Alternatively, the recess (or cavity) 206 can extend completely through the substrate 204, in which case the chip could be inserted from the bottom of the recess (or window).

Note that the wires are spaced farther apart than width of chip (which means that the chip can be inserted from the top side), then (after chip is in place) the wires are re-positioned inward to be over the terminals. The wire bridges may be moved into position with a wire gripper tool (not shown).

After the end portions 210a and 210b of the antenna wire 210 are moved into position over the respective terminals 208a and 208b of the transponder chip 208, they are spaced a distance "s3" apart, which corresponds to the distance between the two terminals 208a and 208b (compare wire spacing "s1" in FIG. 1C).

This method of re-positioning the wire conductor requires a tool (not shown) to form or grip the wires and re-position them above the terminals of the transponder chip, in preparation for interconnection (bonding) with the terminals of the transponder chip. Such a tool is well known, and is referred to in the industry as a "wire gripper". The tool can be in the form of an elongate member terminating in a hook, like a crochet needle, having a diameter approximately equal to the diameter of the wire being gripped (and moved). See, for example, FIG. 8B. In use, two of these hooks, positioned generally parallel with one another and spaced approximately one wire diameter apart, can be used to pull on the wire from two points, rather than one. In FIG. 2B, the re-positioned wire is shown semicircular. It should be understood that if one hook were used to pull on a wire, the repositioned wire would look more triangular (with an apex), and if two closely-spaced hooks were used to reposition the wire, it would look like a triangle with a flat apex (a trapezoid).

In use, a transponder site commences with the wire conductor being mounted into or onto the substrate over a short distance, then drawing the wire conductor over a cavity (or recess) to accommodate the chip as well as the wire bridges and mounting the wire conductor into or onto the substrate in forming an antenna, then drawing the wire conductor over the cavity on the opposite side to create a second wire bridge and finally mounting the wire conductor into or onto the substrate over a short distance before cutting the wire.

In a next step of the process, the insulation of the wire conductor may be removed in preparation for interconnection. The wire is formed so that a loop will extend over the terminal areas of the chip. The forming of the wire can also be before insulation removal.

The chip may be positioned (installed, located, disposed) in the cavity from above or from below (if the recess extends fully through the substrate) using a vacuum suction system to keep the chip in place. And finally, the end portions of the antenna wire are connected to the terminals of the chip.

An advantage to various embodiments of the invention disclosed herein, particularly those that involve mounting the antenna wire before installing the transponder chip, is that this facilitates removal of insulation (coating) from the antenna wire at the end portions of the wire (wire bridges) where bonding to the terminals of the transponder chip (or chip module) will occur. Various problems which may thus be avoided or minimized may include damaging the chip, unwanted reflections from the chip, accessibility to perform the insulation removal process, inspectability of the insulation removal process, etc.

"Jump Loops"

FIG. 2C illustrates an embodiment of the invention which utilizes a "looping" method, and in which a chip (or chip module) and the antenna are positioned on a common substrate, whereby the antenna resides on the top side (front surface) of the substrate and the chip may be inserted from either the top side or the bottom (opposite) side of the substrate. This embodiment is described in greater detail in any of the following patent applications: U.S. 60/911,077 filed 10 Apr. 2007; U.S. Ser. No. 11/733,756 filed 10 Apr. 2007; and PCT/EP2007/059340 filed 6 Sep. 2007.

Generally, the substrate has a rectangular recess or cavity to accommodate a rectangular chip module and the end portions of the antenna wire, which pass nearby (adjacent to) the cavity. The antenna is mounted to the front (top) side (surface) of the substrate, and the chip can be inserted into a recess extending only partway through the substrate from the front surface thereof, after the antenna is mounted to the front surface of the substrate. Or, the chip can be inserted in to a cavity extending all the way through the substrate, from the opposite back (bottom) side (surface) of the substrate.

Generally, in this embodiment, rather than the end portions of the wire passing directly over the terminals of the transponder chip, the end portions of the antenna wire are located adjacent to (next to, rather than directly over) the terminal areas of the chip, and are in the form of loops which extend vertically from the surface of the substrate, in the manner of wire bond loops.

Wire bonding, which is a packaging step which has been used for many years to connect a die to a the package, is a form of interconnection which consists of the performance of a basic bonding cycle: a) formation of the first bond on the die; b) pulling of the wire to the lead frame or bonding post of the package where the second bond will be formed; c) formation of the second bond; and d) cutting of the wire in preparation for the next cycle. The step (b), which feeds and forms the wire that runs from the first to the second bond, involves an action often referred to as 'looping', wherein the wire fed between the bonds takes the form of an arc. The arc formed when the bonding tool traveled in a natural parabolic or elliptical curve is the 'wire loop'. The wire loop is characterized by its shape, length, and height, all of which define what is known as the wire's 'loop profile'.

FIG. 2C illustrates a transponder site 252 (compare 102, 202) on a substrate 254 (compare 104, 204) which may be a portion of an overall inlay sheet 250 (compare 100, 200), whereby a recess 206 (compare 106, 206) is provided for a transponder chip 258 (compare 108, 208). The transponder chip 258 may be disposed in the recess 256 after the antenna 260 (compare 110, 210) is mounted to (embedded in or adhesively place on) the substrate 254.

The chip 258, has two terminals 258a and 258b (compare 108a and 108b), and may be rectangular, having height "h3" and width "w3" dimensions comparable to those of the chip 208. The recess 256 may also be rectangular, having height "h4" and width "w4" dimensions comparable to those of the recess 206. Slots (such as 207a and 207b) may or may not be provided, and are omitted, for illustrative clarity.

End portions 260a and 260b of the antenna wire 260 do not pass directly over respective terminals 258a and 258b of the chip 258. (The end portions 260a and 260b of the antenna wire 260 do not pass over an area which will be occupied by the chip 258.) Rather, the two end portions 260a and 260b of the antenna wire are formed into "loops" 270a and 270b which are disposed adjacent opposite sides of the recess 256, and are spaced apart from one another a distance (s2) which is greater than the width (w3) of the chip 258, so that the chip 258 can be inserted into the recess 256 from the same side of the substrate 304 as the antenna, past the end portions 260a and 260b of the wires, after the antenna has been mounted (embedded in or adhesively placed on) to the substrate 254.

Subsequently, the end portions 260 and 260b of the wire 260 may be manipulated (re-positioned, moved, stretched) so as to be over the terminals 258a and 258b, and are bonded thereto. The loops 270a and 270b of this embodiment may be referred to as "jump loops". The jump loops 270a and 270b may be approximately 2.5 mm in height, and may be pre-positioned approximately 1.5 mm distant from the terminal areas 308a and 308b of the transponder chip 308 (or from the side edges of the recess 256).

The dashed lines extending from the top (as viewed) of the end portion 260a and the bottom (as viewed) of the end portion 260b indicate that the wire continues, forming the antenna coil (see FIG. 1A). The dots at the bottom (as viewed) of the end portion 260a and the top (as viewed) of the end portion 260b indicate that the wire ends (stops, does not continue). Attention is directed to end portions 260a and 260b (compare 210a and 210b) of the antenna wire 260. The end portions 260a and 260b will ultimately be connected to corresponding terminals 208a and 208b, respectively, of the transponder chip 208.

More generally, if the transponder chip 258 is not already in place when the antenna wire 310 is mounted to the substrate, and the two loops 270a and 270b are formed, the reference numeral 258 would refer to a "site" for a transponder chip (or chip module), the reference numeral 258a would refer to a first "terminal area", and the reference numeral 258b would refer to a second "terminal area". Alternatively, a recess or cavity 256 (described in the next paragraph) can be considered to be the "site" for the not-yet-in-position transponder chip 258. The recess or cavity 256 may be formed in the surface of the substrate 254 to help align (locate), as well as to recess (lower the position of), the transponder chip 258. In a multi-layer substrate, the recess or cavity 258 may extend into the substrate from a surface of the substrate, through at least a top layer (compare 104a) of the substrate, extending to a lower layer (compare 104b) of the substrate. When the transponder chip 258 is disposed in (received by) the cavity 256, it will be supported by the lower layer(s) of the substrate. A multi-layer substrate has been illustrated in FIG. 1B.

The loop portions 270a and 270b of the end portions 260a and 260b of the antenna wire 260 (or wires, plural, in the case of a dipole antenna) are not mounted to (embedded in or adhesively placed on) the substrate 202. Rather, in the process mounting, described in greater detail hereinbelow, the loop portions 270a and 270b of the end portions 260a and 260b of the antenna wire 260 are left unmounted, and are thus "free-standing". In this embodiment, the loop portions 270a and 270b of the end portions 260a and 260b of the antenna wire 260 are each formed as generally upside-down U-shaped loops, similar in appearance to a conventional wire-bonding loop. Each of these loops 270a and 270b formed in the end portions 260a and 260b of the antenna wire 260 may be in a plane which may be substantially perpendicular to the surface of the substrate 254. Generally, if the plane of the loops is inclined, it should be inclined away from the transponder site so as not to interfere with subsequent installation of a transponder chip, past the loops, at the transponder site (such as into the recess 256).

When the term "loop" is used herein, it may broadly be taken to include jump loops (like traditional wire bonding loops), planar loops, flat loops, wire bridges, meanders, and any configuration of end portions of the antenna wire pre-positioned adjacent or over the recess or transponder area, so as to permit installation of the transponder chip from the same side of the chip as the antenna, past the pre-positioned (looped) end portions of the antenna wire.

The jump loops 270a and 320b are located adjacent (next to, along side of) first and second terminal areas (or terminals 258a and 258b, if the transponder chip 258 is in place) for the transponder chip 258, in preparation for connecting the loops 270a and 270b to the terminals 258a and 258b of the transponder chip 258 (once it is in place). The loops 270a and 270b can be manipulated, so that in a next step they will be positioned above the terminals 258a and 258b of the transponder chip 258 (once the transponder chip 258 is in its place (256) on the substrate 254).

The loops 270a and 270b subsequently (such as after the transponder chip is in place) be manipulated (drawn in, deflected, moved, bent, repositioned, extended) to be substantially directly over the terminals 258a and 258b of the transponder chip 258, in preparation for interconnection (such as bonding) to the terminals 258a and 258b of the transponder chip 258.

To mount the antenna wire 260, and form the loops 270a and 270b, an embedding tool may be lowered onto the substrate, and the embedding process may commence, at a "starting point" labelled "a".

The embedding tool then moves in a plane (x-y) parallel to the surface of the substrate, but only a short distance sufficient to ensure embedding of the wire, to the point "b", and then the embedding tool stops vibrating and raises up. The distance between the points "a" and "b" may be 5 to 8 mm.

Next, the embedding tool is moved, and this many include rotationally positioning the wire guide, to form a free-standing loop in the wire, between the points "b" and "c". Typically, the free-standing loop will be formed adjacent a terminal area of a device (as discussed hereinabove, which may be before (or after) the device (the transponder chip) is mounted to the substrate The distance between the points "b" and "c" may be 3-5 mm for a chip, or 4-5 mm for a chip module.

The loop (between the points "b" and "c") may be a "jump" loop similar to a wire bonding loop, in a plane which is substantially perpendicular to the surface of the substrate, or the loop may be a wire bridge over a slot in the substrate, substantially in the plane of the substrate. In either case the end portion of the antenna wire is pre-positioned adjacent the terminal area 258a.

Next, at the point "c", loop formation is finished, the embedding tool may again be lowered, embedding of the wire resumes (ultrasonic vibrations start), and the embedding tool moves along a prescribed path, parallel to the surface of the substrate, to form a desired pattern, such as the square coil for the antenna (see, for example, the antenna 110 FIG. 1A).

It may be noted, for example, at the point "d", the embedding tool would need to make a 90-degree turn to form a subsequent (second) side of a rectangular coil antenna. The 90-degree corner angle at point "d" is by way of example. Generally, at some point in making the pattern, the tool will have to make some angle, which need not be 90-degrees, it could be more, or less. (Eventually, after moving around the substrate, mounting (embedding or adhesively placing) the antenna wire, the embedding tool will need to return to near its starting point.)

After mounting the antenna in the desired pattern, and making a final turn at the point "e", embedding continues to a point "f". The next step is similar to the second part of the step 504. At the point "f", the embedding tool stops vibrating and raises up.

Next, a free-standing loop in the wire is formed between the points "f" and "g", adjacent a second terminal area of a device (as discussed hereinabove, which may be before (or after) the device is mounted to the substrate The distance between the points "f" and "g" may be 4 to 5 mm for a chip module.

Next, the embedding tool then moves in a plane (x-y) parallel to the surface of the substrate, but only a short distance sufficient to ensure embedding, to the point "h", and then the embedding tool stops vibrating and a cutting tool (which is typically associated with the embedding tool) severs (cuts) the wire.

The embedding tool can then move to another location on a substrate to prepare another site with an antenna and loops.

The transponder chip 258 may or may not have been in place prior to mounting the antenna and forming the loops. When the transponder chip 258 is in place (installed on the substrate, at the transponder site), the loops are drawn in (re-positioned, manipulated to be) over the terminals, and then the loops are connected (bonded) to the terminals of the transponder chip. If the wire is an insulated wire, there may (or may not) be an insulation removal step before connecting (bonding) the loops to the terminals.

This method of re-positioning the wire conductor may require a tool (described hereinbelow) to push the loops over, thereby re-positioning them to be above the terminals of the transponder chip, in preparation for interconnecting (bonding) them to the terminals of the transponder chip. Such a tool is well known, and may be referred to in the industry as a "wire gripper", and may be similar in design to the hooks used in a pull tester to calculate bond force.

It should be understood that it is not necessary to bond an entire loop (270a, 270b) to a terminal (258a, 258b), rather only a portion thereof, such as a tip (apex) portion of the loop.

It should also be understood that if the antenna wire is an insulated wire, having one or more coatings to assist (for example) in mounting by adhesively placing the antenna wire on the substrate, the coating(s) (self bonding coat and insulation layer) should be removed prior to bonding. Removal of the coating(s) (insulation) from an insulated wire (from the loops, or from tips of the loops—importantly from a portion of the wire that will be bonded to the terminal(s) of the transponder chip) are discussed in greater detail hereinbelow (and may involve using apparatus such as a laser or a hot iron to remove the coating(s)), and can be done (performed) either during mounting the antenna wire, or after having mounted the antenna wire over slots and formed the loops in preparation for bonding.

A self-adhering wire may comprise: a metallic core, a first non-metallic coating disposed on the surface of the metallic core; and a second non-metallic coating disposed on the surface of the first metallic coating. The core may comprise copper, aluminum, doped copper, gold, silver or Litz wire, and may have a diameter of 0.010-0.50 mm (AWG 24-58) (0.0010 mm=100 micron). The range would normally be 10 to 150 microns (μm). The first non-metallic coating, or "base coat" may comprise modified polyurethane, and may have a thickness of only a few microns. The second non-metallic coating, or "bond coat" may comprise polyvinylbutyral or polyamide, and may have a thickness of only a few microns. Litz wire Litz wire is a special type of wire used in electronics.

It consists of many thin wires, individually coated with an insulating film and braided, thus increasing the surface area of the conductor and thereby reducing the skin effect and associated power losses when used with high-frequency applications. The word originated from Litzendraht, German for braidswire.

Throughout the embodiments described herein, any suitable tool for mounting (embedding or adhesively placing) the antenna wire to the substrate may be used, such as the tool disclosed in U.S. Pat. No. 6,698,089. See also WO2000/36891. Some dimensions may be used to illustrate the process, and it should be understood that the dimensions set forth herein are exemplary and illustrative, and should not be construed as limiting.

Throughout the embodiments described herein, when bonding is referred to, bonding may proceed in any conventional manner. Generally, the wire ends of the antenna, ultimately residing over the terminals of the transponder chip, are bonded to the terminals of the chip. The interconnection (bonding) process can for example be inner lead bonding (diamond tool), thermal compression bonding (thermode), ultrasonic bonding or laser welding. Prior to interconnection the insulation layer of the wire conductor can be removed.

Two embodiments for pre-positioning end portions of an antenna wire (or two antenna wires, in the case of a dipole antenna) have been described. In both embodiments, the wire bridge or jump loop comprises an un-mounted (free-standing) end portion of the antenna wire, substantially the entire remainder of the antenna wire being mounted to (embedded in or adhesively positioned on) the substrate. The free-standing end portions of the antenna wire, whether wire bridges or jump loops or the like (other configurations are possible), may be referred to herein as "free-standing loops". Other embodiments of what may also be considered to be "free-standing loops" (un-mounted end portions of the antenna wire) are described hereinbelow.

Some important features of the invention disclosed herein include pre-positioning end portions of the antenna wire adjacent a transponder chip area (or recess), and sufficiently wide apart so that the transponder chip may be installed, after the antenna wire has been mounted, from the same side of the substrate as the antenna. Because the antenna wire may be mounted before the transponder chip is installed, insulation may be removed from portions of the antenna wire which will be bonded to the terminals of the transponder chip without interference from, or damage to the transponder chip.

Moving the Chip (FIGS. 3A-3E)

In the previously described embodiment, the end portions of the antenna wire are initially placed on the substrate wider apart than the chip, spanning a recess (or slots on side edges of the recess), and the end portions of the wire are subsequently repositioned to be over the terminals of the chip, for bonding thereto. Insulation may be removed from the end portions of the wire spanning the recess (or slots) prior to mounting the chip in the recess.

This embodiment of the invention involves providing an enlarged (oversized) recess (cavity, window) to accept the chip, and creating "wire bridges" spanning the oversized cavity, the wires being spaced sufficiently apart that a chip may be installed between the wires, into the recess. The substrate may be a multi-layer substrate.

Generally, the two wire bridges (end portions of the antenna wire spanning the recess) are spaced farther apart than the width of the chip, so that the chip can be inserted into the recess from the same (top) side of the substrate, past the two wire end portions of the antenna which are bridging (extending across) the recess, after then antenna has been mounted to the substrate.

The recess is significantly larger (in width) than the chip, so that the chip can be repositioned (moved) side-to-side within the recess. (The recess in the surface of the substrate is sufficiently large to allow the relative motions between the transponder chip and the substrate.) In a first repositioning step, the chip is repositioned so that a first terminal of the chip is disposed under a corresponding first end portion of the antenna which is bridging the recess, and the end portion of the antenna wire is bonded thereto. In a second repositioning step, the chip is repositioned so that a second terminal of the chip is disposed under a corresponding second end portion of the antenna wire which is bridging the recess, and the end portion of the antenna is bonded thereto. (Since the chip has already been bonded to the first end of the antenna, some slack should be left in the first end of the antenna when forming the bridge so that it does not impair the sideways movement of the chip to the second position.) In these repositioning steps, the chip may by moved sideways with a suitable chip manipulating tool, such as a pipette, not shown.

For example a chip having a width of 4 mm (4000 µm) can be placed in a recess having a width of 6 mm (6000 µm), so that the chip can be moved 1 mm in either direction. The terminals of the chip may be 0.5 mm (500 µm) inward from a side edge of the chip, and thus spaced 3 mm apart from one another. The two wire ends, bridging the recess generally parallel with one another, may spaced 5 mm from one another, which permits the chip (4 mm width) to be inserted therebetween.

After the first bond, the chip may be moved 2 mm (2000 µm) so that the second terminal is under the second end of the wire, for bonding thereto. Slack can be created in the wire, to facilitate movement of the chip, by forming embedding or partially-embedded squiggles (by reduced force of the sonotrode embedding the wire) the wire into the substrate with "squiggles" at the ends of the bridges (the four bridge starting/ending points) so that as the wire rips out, there is some slack to accommodate movement of the chip.

According to a feature of the invention, after forming the antenna having end portions passing over (bridging) the recess, insulation may be removed from the wire in preparation for bonding to the terminals of the chip, prior to installing the chip in the recess. Insulation removal may be done with a laser, not shown.

FIGS. 3A-3E illustrate a transponder site 302 (compare 102, 202) on a substrate 304 (compare 104) which may be a portion of an overall inlay sheet 300 (compare 100), whereby an oversized recess 306 (compare 106, 206) is provided for a transponder chip 308 (compare 108, 208). The transponder chip 308 may be disposed in the recess 306 after the antenna 310 (compare 110, 210) is mounted (embedded in or adhesively place on) the substrate.

The chip 308, has two terminals 308a and 308b, and may be rectangular, having a height dimension "h5" and a width dimension "w5". The chip 308 may be a chip module measuring measure h5=4.0 mm by w5=6.0 mm.

The recess 306 is also rectangular (generally, the same shape as the chip), having a height dimension "h6" and a width dimension "w6". The height dimension h6 of the recess may be only slightly larger, such as 0.1 mm greater, than the height dimension h5 of the chip. This (the height of the recess only slightly larger than the height of the chip) is generally the same as the situation illustrated in FIG. 1C.

The width dimension w6 of the recess 306 is substantially (much) larger, such as 3 mm-4 mm greater, than the width dimension w5 of the chip 308. For example, given a chip 308 measuring h5=4 mm and w5=6 mm, the recess 306 may have dimensions of h6=4.1 mm and w6=10 mm. In other words, the width dimension w6 of the recess 306 is significantly greater than the width dimension w5 of the chip 308, such as 40% greater, including at least 20% greater, at least 25% greater, at least 30% greater, at least 40% greater, at least 50% greater, at least 60% greater.

As in the previous embodiment (FIGS. 2A-2B), end portions 310a and 310b of the antenna wire 310 do not pass directly over respective terminals 308a and 308b of the chip

308. Rather, the two end portions 310*a* and 310*b* of the antenna wire, which may be referred to as "wire bridges", span (bridge, pass over) the recess 306, and are spaced apart from one another a distance (s4) which is greater than the width (w5) of the chip 308, so that the chip 308 can be inserted into the recess 306 from the same side of the substrate as the antenna, past the end portions of the wires, after the antenna has been mounted (embedded in or adhesively placed on) to the substrate. Subsequently, as described in greater detail hereinbelow, the chip 308 is moved (re-positioned, manipulated) so that its terminals 308*a* and 308*b* are under respective ones of the end portions 310*a* and 310*b* of the antenna wire 310, for bonding thereto.

The dashed lines extending from the top (as viewed) of the end portion 310*a* and the bottom (as viewed) of the end portion 310*b* indicate that the wire continues, forming the antenna coil (see FIG. 1A). The dots at the bottom (as viewed) of the end portion 310*a* and the top (as viewed) of the end portion 310*b* indicate that the wire ends (stops, does not continue).

Figure 3A:
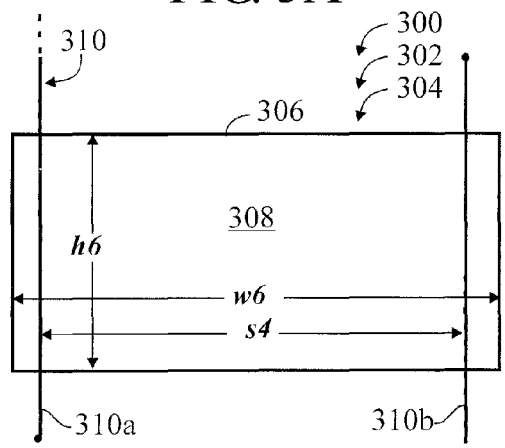

FIG. 3A shows the enlarged cavity 306 in a substrate. The cavity 306 may measure w6=10 mm and h6=5 mm. The figure shows end portions 310*a* and 310*b* of the antenna wire 310 bridging (spanning) the cavity 306 near the outer edges thereof. The end portions 310*a* and 310*b* of the antenna wire 310 may be spaced (for example) 0.5 mm inward from the respective left and right side edges of the cavity 306, in which case the distance s4 between the two wire bridges would be 8 mm (10 mm−1mm−1mm).

The insulation or coating (if any) on the end portions 310*a* and 310*b* of the antenna wire 310 may be removed at this stage, such as with a laser (not shown).

Figure 3B:
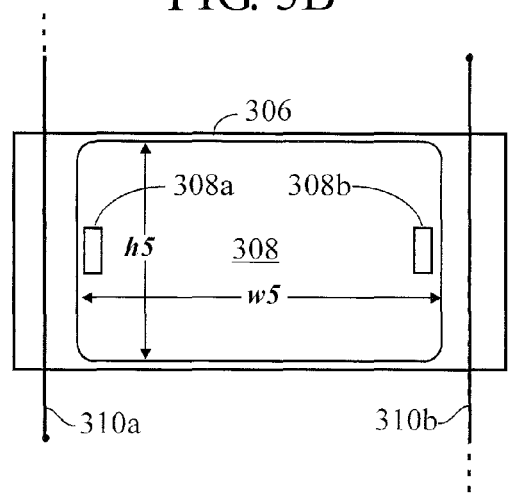

FIG. 3B shows a chip module 308 inserted into the cavity 306. This chip module 308 may measure w5=6 mm by h5=4 mm. Since w5 (6 mm, in this example) is less than s4 (8 mm, in this example), the chip module 308 fits easily between the end portions 310*a* and 310*b* of the antenna wire 310. The chip module 308 is shown centered in the cavity 306.

Figure 3C:
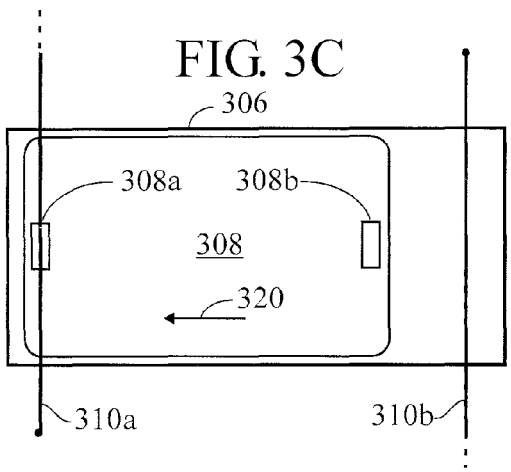

In FIG. 3C, the chip is moved, such as 1.0 mm, as indicated by the arrow 320, to one side of the cavity 306 so that a first terminal 308*a* is positioned under a first one 310*a* of the end portions (wire bridges) of the wire 310, and the end portion 310*a* of the wire 310 is bonded to the terminal 308*a* using any suitable conventional means for bonding (not shown in this figure, see 118 in FIG. 1B). This movement of the chip imparts a relative motion between the chip and the substrate, hence between the chip and the end portions of the wire mounted to the substrate.

Figure 3D:
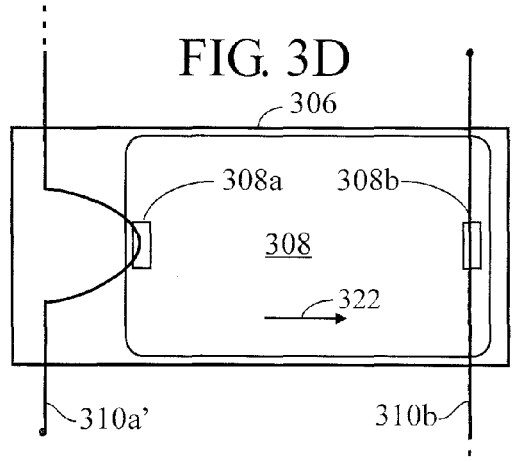

In FIG. 3D, the chip is moved, such as 2.0 mm (1.0 mm to its original position, then 1.0 mm further), as indicated by the arrow 322, to the other side of the cavity 306 so that a second terminal 308*b* is positioned under a second one 310*b* of the end portions (wire bridges) of the wire 310, and the end portion 310*b* of the wire 310 is bonded to the terminal 308*b* using any suitable conventional means for bonding (not shown in this figure, see 118 in FIG. 1B). This movement of the chip imparts a relative motion between the chip and the substrate, hence between the chip and the end portions of the wire mounted to the substrate.

As shown in FIG. 3D, this movement of the chip module 308 "drags" (deforms, stretches) the first one 310*a*' (prime) of the end portions (wire bridges) of the wire 310. The wire itself can typically stretch a little. Some slack can be left in the wire. Immediately before bridging the cavity, the wire can be lightly embedded in a curve pattern, such as squiggles, so that it can "play out" (become un-embedded, locally) and "follow" the chip module 308 as the chip module 308 is repositioned. The process can be terminated here, with the chip module 308 being located of center within the cavity 306.

Figure 3E:
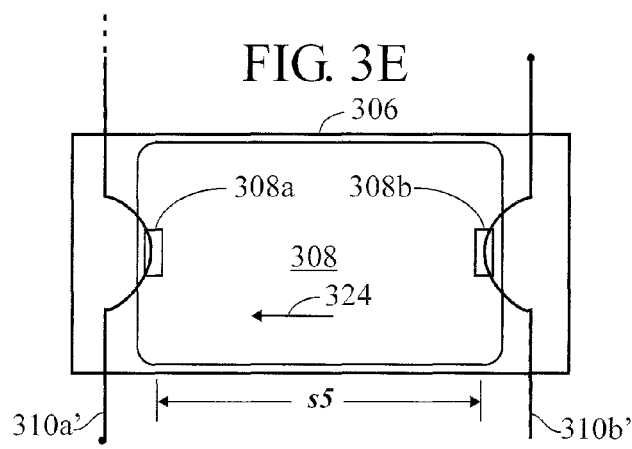

FIG. 3E illustrates that the chip module 308 may be moved, such as 1.0 mm, as indicated by the arrow 324, back to a center position within the cavity 306 and, as shown in this figure, this movement of the chip module 308 "drags" (deforms, stretches) the second one 310*b*' (prime) of the end portions (wire bridges) of the wire 310 along with it. The first one 310*a* of the end portions (wire bridges) of the wire 310 may become somewhat "bunched up" by this movement. This movement of the chip imparts a relative motion between the chip and the substrate, hence between the chip and the end portions of the wire mounted to the substrate.

Whereas, initially, as shown in FIG. 3A, the end portions 310*a*/310*b* of the wire 310 are spaced a distance s4 apart from one another which is wider than the width dimension w5 of the chip 308 (s4>w5), it can be seen in FIG. 3E (also FIG. 3D) that the end portions 310*a*'/310*b*' of the wire 310 have been deformed, so as to be finally closer with one another, spaced a distance s5 apart from one another which is less than the initial spacing s4 (s5<s4). The distance s5 between "bonding portions" of the end portions 310*a*'/310*b*' of the wire 310 is slightly less than the width w5 of the chip 308 so that the bonding portions of the wire which are to be interconnected (bonded) to the terminals of the chip are spaced apart approximately equal to the spacing (not labeled) between the terminals 308*a*/308*b* of the chip.

In use, a transponder site commences with the wire conductor being mounted into or onto the substrate over a short distance, then drawing the wire conductor over the enlarged cavity to accommodate the chip as well as the wire bridges, mounting the wire conductor into or onto the substrate in forming an antenna, then drawing the wire conductor over the cavity on the opposite side to create a second wire bridge and finally mounting the wire conductor into or onto the substrate over a short distance before cutting the wire.

In the next step of the process, the insulation of the wire conductor may be removed in preparation for interconnection.

The chip 308 may be positioned into the enlarged cavity 306 from above using a conventional pick & place system (not shown). The chip can shift (slide) from right to left (side-to-side), horizontally in the cavity (until it reaches the side edges of the cavity), while its movement is restricted in the vertical direction by the top and bottom (as viewed) side edges of the cavity 306.

A conventional suction pipette (not shown) may be used to align the chip under the first wire bridge and the wire conductor is bonded to the first terminal area on the chip. Then the chip is aligned to the second wire bridge and the wire conductor is bonded to the second terminal area on the chip.

To protect the bond areas an epoxy (not shown) can be dispensed. In addition, a flexible adhesive (not shown) can be dispensed in the chip cavity before placing the chip.

Moving the Substrate (FIGS. 4A-4E)

Generally, as described above, in a transponder the two end portions of the antenna need to be interconnected (such as by bonding) to two corresponding terminals of the chip (or chip module).

In the prior art described with respect to FIG. 1C, the recess has a width (w2) which is only slightly (such as 2%) larger (50 to 100 microns) than the width (w1) of the chip. The two end portions of the antenna wire span (bridge) the recess, and are spaced apart from one another a distance (s1) which is less than the width (w1) of the chip, and which is substantially equal to the spacing of the terminals of the chip. Generally speaking, because the wires (wire bridges) are "in the way", the chip cannot be inserted into the recess from the same side of the substrate as the antenna, past the end portions of the wires, and is therefore generally disposed in the recess prior to the antenna being mounted to the substrate. (Or, the chip must be inserted from the opposite side of the substrate.) The antenna is mounted with the end portions of the wires passing directly over the chip terminals, and are bonded thereto.

In the embodiment of the invention described with respect to FIGS. 2A-2B, the recess (including the slots) has a width (w4) which is more than slightly greater than the width (w3) of the chip. The two end portions of the antenna wire span (bridge) the recess, and are spaced apart from one another a distance (s2) which is greater than the width (w3) of the chip, so that the chip can be inserted into the recess from the same side of the substrate as the antenna, past the end portions of the wires. Subsequently, the end portions of the wires are manipulated (re-positioned) so as to be over the terminals, and are bonded thereto. In simple terms, the wire is mounted, the wire bridges are initially spaced wide apart, the chip is inserted, and the wire bridges are "directly" manipulated to be closer together for bonding to the terminals of the chip.

In the embodiment of the invention described with respect to FIGS. 3A-3E, the recess has a width (w6) which is substantially greater than the width (w5) of the chip. The two end portions of the antenna wire span (bridge) the recess, and are spaced apart from one another a distance (s4) which is greater than the width (w5) of the chip, so that the chip can be inserted into the recess from the same side of the substrate as the antenna, past the end portions of the wires. Subsequently, the chip is moved, from side-to-side, so that in a given position, each of the terminals is under a corresponding one of the end portions of the wires, and the end portions of the wire are bonded to the terminals. In simple terms, the wire is mounted, the wire bridges are initially spaced wide apart, the chip is inserted and is sequentially moved to bring its terminals into position under the wire bridges for bonding thereto, a result of which is, as in the FIGS. 2A-2B embodiment, the wire bridges are "indirectly" caused to be closer together for bonding to the terminals of the chip.

Generally, the movement of the chip module 308 within the recess 306 may be considered to be a "relative motion" between the chip module 308 and the substrate, wherein either one of (or both of) the chip module and or the substrate can be moved, relative to the other, to position the terminals of the chip module under the corresponding end portions of the antenna wire, for bonding thereto. As described in greater detail hereinbelow, in simple terms, the wire is mounted, the wire bridges are initially spaced wide apart, the chip is inserted and is the substrate is sequentially moved to bring the chip's terminals into position under the wire bridges for bonding thereto, a result of which is, as in the FIGS. 2A-2B embodiment, the wire bridges are brought closer together for bonding to the terminals of the chip.

In the embodiment of the invention now described with respect to FIGS. 4A-4E, rather than moving the chip module while the substrate remains fixed, the substrate is moved while the chip module remains fixed. Since the situation is one of relative motion, no additional figures are required. However, to add clarity, FIGS. 4A-4E are cross-sections, rather than top views.

Generally, FIGS. 4A-4E correspond with FIGS. 3A-3E, but the height dimensions (h5 and h6) will not be visible in these cross-sectional views.

Generally, in FIGS. 4A-4E, a selected one of the transponder areas 402 (compare 102) constituting a single transponder is shown in detail. As was the case described hereinabove with respect to FIG. 1A, there may be additional transponder areas (and corresponding additional transponders) disposed to the left and right of, as well as above and below, the transponder 102, on an inlay sheet. Such a plurality of transponders may be arranged in an array on the (larger) inlay sheet.

The inlay sheet 400 (compare 100) may be a multi-layer substrate. As illustrated in FIGS. 4A-4E, the inlay sheet 400 may comprise one or more upper (top) layers 404a and one or more lower (bottom) layers 404b.

A recess 406 (compare 106, 306) may be formed in the upper layer 404a, at a "transponder chip site", so that a transponder chip 408 (compare 108, 308) may be disposed in the recess, and supported by the lower layer 404b. The transponder chip 408 is shown having two terminals 408a and 408b on a top surface thereof. As is the case in all of the embodiments described herein, the transponder chip may be a single chip or a chip module.

FIGS. 4A-4E illustrate a transponder site 402 (compare 302) on a substrate 400 (compare 100), whereby an oversized recess 406 (compare 306) is provided for a transponder chip 408 (compare 308). The transponder chip 408 may be disposed in the recess 406 after the antenna 410 (compare 310) is mounted (embedded in or adhesively place on) the substrate 400.

The chip 408, has two terminals 408a and 408b, and may be rectangular, having a height dimension "h7" (not visible in this view, but may be the same as h5) and a width dimension "w7" (which may be the same as w5). The chip 408 may be a chip module measuring measure h5=4.0 mm by w7=6.0 mm.

The recess 406 is also rectangular (generally, the same shape as the chip), having a height dimension "h8" (not visible in this view, but may be the same as h6) and a width dimension "w8" (which may be the same as w6).

The height dimension h6 of the recess may be only slightly larger, such as 0.1 mm greater, than the height dimension h5 of the chip. (This is similar to what was discussed with respect to the FIGS. 3A-3E embodiment, as well as the FIGS. 2A-2B embodiment.)

The width dimension w8 of the recess 406 is much larger, such as 3 mm-4 mm greater, than the width dimension w7 of the chip 408. For example, given a chip 408 measuring h7=4 mm and w7=6 mm, the recess 406 may have dimensions of h8=5 mm and w8=10 mm. In other words, the width dimension of the recess 406 is significantly greater than the width dimension of the chip 408, such as 40% greater, including at least 20% greater, at least 25% greater, at least 30% greater, at least 40% greater, at least 50% greater, at least 60% greater.

As in the previous embodiment (FIGS. 3A-3E), end portions 410a and 410b of the antenna wire 410 do not pass directly over respective terminals 408a and 408b of the chip 408. Rather, the two end portions 410a and 410b of the antenna wire span (bridge) the recess 406, and are spaced apart from one another a distance (s6) which is greater than the width (w7) of the chip 408, so that the chip 408 can be inserted into the recess 406 from the same side of the substrate as the antenna, past the end portions of the wires, after the antenna has been mounted (embedded in or adhesively placed on) to the substrate. Subsequently, as described in greater detail hereinbelow, the substrate 402 is moved (re-positioned, manipulated) so that its terminals 408a and 408b are under respective ones of the end portions 410a and 410b of the antenna wire 410, for bonding thereto.

Figure 4A:
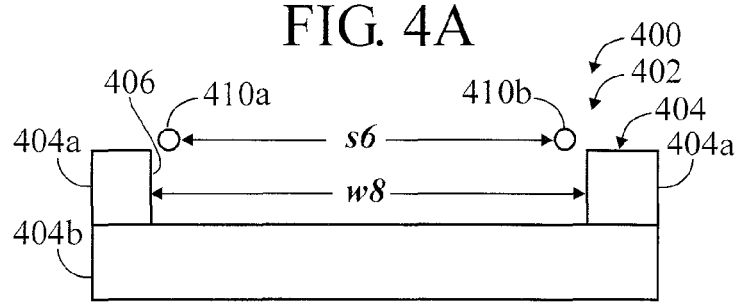

FIG. 4A shows the enlarged cavity 406 in a substrate 402. The cavity 406 may measure w8=10 mm. The figure shows end portions 410a and 410b of the antenna wire 410 bridging (spanning) the cavity 406 near the outer edges thereof. The end portions 410a and 410b of the antenna wire 410 may be spaced (for example) 0.5 mm inward from the respective left and right side edges of the cavity 406, in which case the distance s6 between the two wire bridges would be 8 mm (10 mm−1 mm−1 mm=8 mm).

The insulation or coating (if any) on the end portions 410a and 410b of the antenna wire 410 may be removed at this stage, such as with a laser (not shown).

Figure 4B:
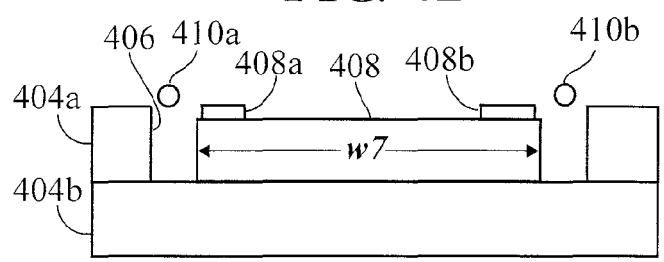

FIG. 4B shows a chip module 408 inserted into the cavity 406. This chip module 408 may measure w7=6 mm. Since w7 (6 mm, in this example) is less than s6 (8 mm, in this example), the chip module 408 fits easily between the end portions 410a and 410b of the antenna wire 410. The chip module 408 is shown centered in the cavity 406.

Figure 4C:
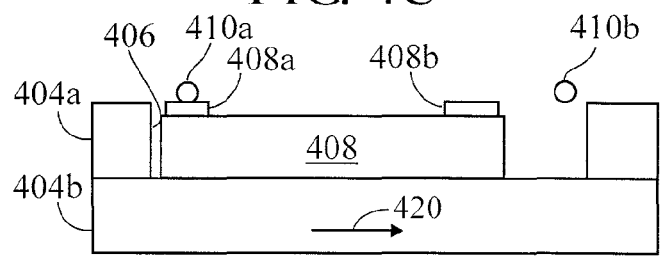

In FIG. 4C, the substrate 402 is moved, such as 1.0 mm, as indicated by the arrow 420, so that the chip 408 is positioned to one side of the cavity 406, so that a first terminal 408a is positioned under a first one 410a of the end portions (wire bridges) of the wire 410, and the end portion 410a of the wire 410 is bonded to the terminal 408a using any suitable conventional means for bonding (not shown in this figure, see 118 in FIG. 1B). This movement of the substrate imparts a relative motion between the chip and the substrate, as described hereinabove.

Figure 4D:
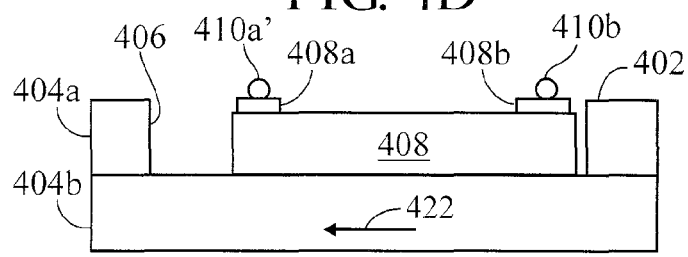

In FIG. 4D, the substrate 402 is moved, such as 2.0 mm (1.0 mm to its original position, then 1.0 mm further), as indicated by the arrow 422, so that the chip 408 is positioned to the other side of the cavity 406, so that a second terminal 408b is positioned under a second one 410b of the end portions (wire bridges) of the wire 410, and the end portion 410b of the wire 410 is bonded to the terminal 408b using any suitable conventional means for bonding (not shown in this figure, see 118 in FIG. 1B). This movement of the substrate imparts a relative motion between the chip and the substrate, as described hereinabove.

As mentioned hereinabove, and as shown in FIG. 4D, this relative movement of the substrate and the chip module will "drag" (deform, stretch) the first one 410a' (prime) of the end portions (wire bridges) of the wire 410.

Figure 4E:
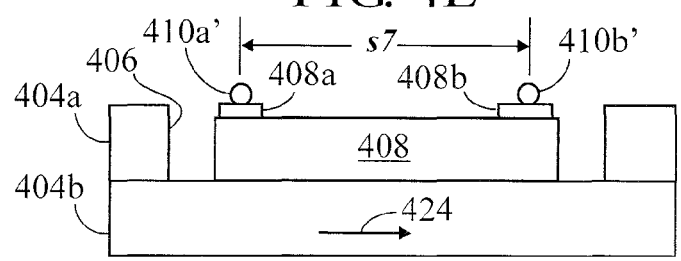

FIG. 4E illustrates that the substrate 402 may be moved, such as 1.0 mm, as indicated by the arrow 324, back to its original position, with the chip module 408 centered within the cavity 406, which will drag the second one 410b' (prime) of the end portions (wire bridges) of the wire 410 along with it, as discussed hereinabove with respect to FIG. 3E. This movement of the substrate imparts a relative motion between the chip and the substrate, as described hereinabove.

Whereas, initially, as shown in FIG. 4A, the end portions 410a/410b of the wire 410 are spaced a distance s6 apart from one another which is wider than the width dimension w7 of the chip 408 (s6>w7), it can be seen in FIG. 4E (also FIG. 4D) that the end portions 410a/410b of the wire 410 have been deformed, so as to be finally closer with one another, spaced a distance s7 apart from one another which is less than the initial spacing s7 (s7<s6). The distance s7 between "bonding portions" of the end portions 410a/410b of the wire 410 is slightly less than the width w7 of the chip 408 so that the bonding portions of the wire which are to be interconnected (bonded) to the terminals of the chip are spaced apart approximately equal to the spacing (not labeled) between the terminals 408a/408b of the chip.

It may be noted, looking at FIGS. 4B-4E, that the chip module 408 is always in the same position (horizontally) on the sheet, and the substrate 402 is in different horizontal positions—centered in FIG. 4B, positioned to the right in FIG. 4C, positioned to the left of center in FIG. 4D, and centered (re-centered) in FIG. 4E. This is in contrast with what is shown in FIGS. 3B-3E, where the substrate (as represented by the recess 306) is always in the same position (albeit in different positions on the sheet), and it is the chip that moves within the recess-centered in FIG. 3B, positioned to the left in FIG. 3C, positioned to the right of center in FIG. 3D, and re-centered in FIG. 3E.

In use, a transponder site commences with the wire conductor being mounted into or onto the substrate over a short distance, then drawing the wire conductor over the enlarged cavity to accommodate the chip as well as the wire bridges, mounting the wire conductor into or onto the substrate in forming an antenna, then drawing the wire conductor over the cavity on the opposite side to create a second wire bridge and finally mounting the wire conductor into or onto the substrate over a short distance before cutting the wire.

In the next step of the process, the insulation of the wire conductor may be removed in preparation for interconnection.

The chip is positioned into the enlarged cavity from above using a conventional pick & place system (not shown). The substrate can shift from right to left (side-to-side), so that the chip is in different positions in the cavity.

A suction pipette (not shown) may be used to insert the chip into the recess and to hold the chip in a fixed position while the substrate is moving, to position the terminals under corresponding end portions (bridges) of the antenna wire, as described above.

If the recess extends all the way through the substrate, the chip can be inserted and maintained in its "fixed" position from below.

A recess extending all the way through the substrate (which may be referred to as a "window") may be advantageous in that it allows the chip to reside on a hard (such as ceramic), pre-heated (such as to 100 degrees-C.) work surface during bonding, which can improve thermode ageing problems. Also, for mounting (such as embedding) the wire, having the substrate on a hard surface may be advantageous. A window also allows for the use of a UV laser and optics, from either above or below, for removal of insulation from the wire.

Ceramic insert(s) may be included in the work plate. The chip may be held under vacuum to the work surface, and under the terminal areas of the chip there are ceramic plates to enhance the bonding process. In the case of a die, the entire chip may sit on a ceramic plate. The ceramic plate can be heated.

To protect the bond areas an epoxy (not shown) can be dispensed. In addition, a flexible adhesive (not shown) can be dispensed in the chip cavity before placing the chip.

Generally, it can be seen that the recesses 206, 306, 406 are sufficiently larger than the chip 208, 308, 408 so that the end portions of the wires can be spaced farther apart than the width of the chip. After installing the chip in the recess, the wires are brought closer together (by moving at least one of the wires, either "directly" or "indirectly") so that they are both disposed over corresponding terminals of the chip, for bonding thereto.

In the FIGS. 2A-2B embodiment, the chip and the substrate remain stationary, and the end portions of the wires are (directly) moved, closer together, to be over the terminals of the chip, which are located on opposite sides of the chip. It is within the scope of the invention that both the vertical and the horizontal dimensions of the recess can be enlarged—for example, with a first wire being able to be moved in the horizontal direction to be over a first terminal of the chip and a second wire being able to be moved in the vertical direction to be over a second terminal of the chip (such as on an adjacent, rather than an opposite side of the chip). The same concept can be applied in the FIGS. 3A-3E and FIGS. 4A-4E embodiments—namely, having an oversize recess which is substantially larger in both orthogonal directions, and causing relative movement of the chip (by moving the chip and/or the substrate) to position the terminals of the chip to be under the wire bridges, for bonding thereto.

Generally, it can be seen that the recesses 306 and 406 have widths w6 and w8, respectively, which are substantially greater than the width (w5, w7) of the chip. The two end portions of the antenna wire span (bridge) the recess, and are spaced apart from one another a distance (s4, s6) which is greater than the width (w5, w7) of the chip, so that the chip can be inserted into the recess from the same side of the substrate as the antenna, past the end portions of the wires. Subsequently, the chip 308 or the substrate 404 is moved, from side-to-side, so that in a given position, each of the terminals of the chip is under a corresponding one of the end portions of the wires, and the end portions of the wire are bonded to the terminals.

In these two embodiments (moving the chip, moving the substrate), the wire is not "actively" or "directly" moved per se (such as with a wire gripper), but it moves ("indirectly") after being bonded to a chip (see FIGS. 3D and 4D, as well as FIGS. 3E and 4E). Generally, the recess is significantly wider than the chip in only one dimension (width), and the chip or substrate move from side-to-side to position two terminals disposed on opposite sides of the chip under two parallel wire bridges. It is within the scope of the invention that the terminals may be arranged differently on the chip, and that both the vertical and the horizontal dimensions of the recess can be enlarged—for example, so that the chip or the substrate can be moved in a first (such as horizontal) direction to position a first terminal under a first one of the wire bridges, and so that the chip or the substrate can be moved in a second (such as vertical) direction to position a second terminal under a second one of the wire bridges.

In order to interconnect a crossing wire ("wire bridge") to a terminal area on the chip or chip module, the substrate (or chip) is simply moved either right or left, resulting in the crossing wire to be exactly over the terminal area of a chip or chip module at each transponder site in the array. The crossing wire can be first treated with ultraviolet laser to remove the insulation, before bonding the section of un-insulated wire to the terminal area. Having completed the interconnection of one side of the cavity, the substrate is moved in the opposite direction, so as to align the second crossing wire over the terminal area of the chip or chip module at each transponder site in the array. Again, the wire insulation can be removed by laser and the un-insulated section of the wire is bonded to a terminal area.

As the substrate has index holes to fix its' position on the work plate, pins passing through the index holes can be moved to shift the substrate in either direction, so as to align the wire ends of the antenna over a terminal area of a chip or chip module.

A vision system (not shown) may be needed to ensure accurate positioning during relative movement of the chip.

Regarding thermode ageing, it should be understood that the conventional method to interconnect the wire ends of an antenna to the terminal areas of a chip module is by means of thermal compression bonding. The method makes use of heat by passing pulses of electric current through a thermode and simultaneously applying pressure to cause a diffusion process between the wire and the lead frame of the chip module. The main disadvantages of thermal compression bonding are the ageing of the thermode which requires regular replacement and residues of wire insulation remaining underneath the bonded wire which affects the long term reliability of the interconnection.

This thermode ageing problem can be exacerbated if the chip is not held securely in place, on a rigid work surface. The approach described hereinabove, with respect to FIGS. 4A-4E, provide an opportunity to keep the chip in a fixed position, while causing the aforementioned relative motion between the chip and the wire bridges to bring the terminals of the chip into position for bonding thereto.

Normally (such as may be exemplified by FIGS. 14 and 15 of U.S. Pat. No. 6,698,089), the chip is mounted into the recess first and then the wire is embedded in the substrate. The wires cross over the terminal areas of the chip and thus lie above the terminals. This means that the chip is supported by an underlying substrate. This can cause problems, as follows. Since the chip is supported by the underlying substrate (synthetic material) which is elastic, its surface is not ideal for the bonding process.

For a reliable interconnection and to prevent rapid ageing of the thermode during thermal compression bonding, the surface should be hard like ceramic. Therefore, the current technique of placing the chip in a recess before embedding or placing the chip from below is not conducive for a reliable interconnection in the next stage of the process. The number of bonds which can be achieved using the traditional method is 5,000, whereas with a ceramic plate (heated hot plate), the thermode can withstand 20,000 bonds.

Repositioning the Chip Relative to the Wire Bridges

The transponder illustrated in FIGS. 1A-1C comprises:
 a generally planar substrate which may be a multi-layer substrate, having a recess extending at least partway through the substrate, from a front surface thereof to the back surface thereof,
 an antenna mounted to the front surface of the substrate, and the two end portions of the antenna spanning the recess, as "wire bridges"; and
 a transponder chip (or module) disposed in the recess.

Some limitations of the arrangement illustrated in FIGS. 1A-1C may include:
 (i) if it desired that the antenna be mounted to the substrate before the transponder chip is installed, since the wire bridges are parallel, and are spaced a distance "s1" apart which is less than smaller of the two dimensions "w1" and "h1" of the transponder chip, the recess must extend entirely through the substrate and the transponder chip must be installed from the bottom of the substrate; else
 (ii) if it desired that the recess does not extend all the way through the substrate, due to the wire bridge spacing, the transponder chip must first be disposed in the recess before the antenna wire is mounted to the substrate.

An alternative to the problem set forth in (ii) would be to somehow mount the antenna wire to the front side of the substrate with the end portions of the antenna wire positioned out of the way, then install the transponder chip in the recess from the front side of the substrate, then reposition (manipulate) the end portions of the antenna wire to be over the terminals of the antenna chip, for bonding thereto. However, it is believed that manipulating the wires to be in position over the terminals may have other problems associated therewith, which are sought to be avoided by the present invention.

FIGS. 5A-5D illustrate an embodiment of the invention, wherein the substrate has a recess or cavity to accommodate a rectangular chip module and the end portions of the antenna wire pass over (span, bridge) the cavity. The antenna is mounted to the front (top) side (surface) of the substrate, and the chip can be inserted into a recess extending only partway through the substrate from the front surface thereof, after the antenna is mounted to the front surface of the substrate. Or, the chip can be inserted in to a cavity extending all the way through the substrate, from the opposite back (bottom) side (surface) of the substrate.

In this embodiment, rather than the end portions of the wire passing directly over the terminals of the transponder chip, the end portions of the antenna wire are located adjacent to (next to, rather than directly over) the terminal areas of the chip, and thus form a wire bridge on each side of the chip. The chip module may be positioned in the cavity with the end portions of the antenna wire already stretching over (passing over, spanning, bridging) the cavity (or recess) and mounted to (embedded in or adhesively placed onto) the surface of the substrate.

Generally, as used herein describing embodiments of the invention, the "transponder chip" is an electronic component comprising (having at least) two terminals, which may be a single chip, or a module comprising (having at least) a chip. Generally, the two terminals of the chip or module are interconnected with corresponding two end portions of the antenna wire which is mounted to a top surface of a substrate, which may be a multilayer substrate.

Generally, as used herein describing embodiments of the invention, the transponder chip is disposed in a "recess" or "cavity" which is an opening extending at least partially through the substrate. A "window" is generally an opening that may extend fully through the substrate. A "slot" is another opening (or hole) extending through the substrate next to a recess, cavity or window. In some embodiments, any of recess, cavity, window, or slot (and combinations thereof) may be used, and when the term "recess" is used, it should be understood to include all the variations and combinations, as may be appropriate from the context.

As used herein, a "recess" is generally (and usually) an opening extending only partially through a (typically) multilayer substrate (the recess may extend completely through top layers only), as may be exemplified by the recess 106 (FIG. 1B). The term "cavity" may be used interchangeably with "recess". A "window" is generally (and usually) an opening extending completely through a substrate (whether or not multilayer), as may be exemplified by the opening 56 in FIG. 6 of U.S. Pat. No. 6,698,089.

An advantage to various embodiments of the invention disclosed herein, particularly those that involve mounting the antenna wire before installing the transponder chip, is that this facilitates removal of insulation (coating) from the antenna wire at the end portions of the wire (wire bridges) where bonding to the terminals of the transponder chip (or chip module) will occur. Various problems which may thus be avoided or minimized may include damaging the chip, unwanted reflections from the chip, accessibility to perform the insulation removal process, inspectability of the insulation removal process, etc.

This embodiment of the invention involves providing an enlarged (oversized) recess (cavity, window) to accept the chip, and creating "wire bridges" spanning the oversized cavity, the wires being spaced sufficiently apart that a chip may be installed between the wire bridges, into the recess. The substrate may be a multi-layer substrate.

Generally, the two wire bridges (end portions of the antenna wire spanning the recess) are spaced farther apart than the width of the chip, so that the chip can be inserted into the recess from the same (top) side of the substrate, past the two wire end portions of the antenna which are bridging (extending across) the recess, after then antenna has been mounted to the substrate.

The recess is sufficiently larger than the chip, so that the chip can be repositioned (moved about) within the recess, such that the terminals of the chip can be re-located to be directly under the wire bridges, for bonding the wire bridges to the terminals. The chip may be moved/repositioned within the recess with a suitable chip manipulating tool, such as a conventional pipette, (not shown).

According to a feature of the invention, after mounting the antenna wire so that the end portions form wire bridges over the recess, insulation may be removed from the wire in preparation for bonding to the terminals of the chip, prior to installing the chip in the recess. Insulation removal may be done with a UV laser, not shown.

According to another feature of the invention, after mounting the antenna wire so that the end portions form wire bridges over the recess, the wire may be flattened to enhance subsequent bonding to the terminals of the chip.

FIGS. 5A-5D illustrate a transponder site 502 (compare 102) on a substrate 504 (compare 104) which may be a portion of an overall inlay sheet 500 (compare 100), whereby an oversized recess 506 (compare 106, which is not an "oversize" recess) is provided for a transponder chip 508 (or chip module, compare 108). The transponder chip 508 may be disposed in the recess 506 after the antenna wire 510 (compare 110) is mounted (embedded in or adhesively place on) the substrate 504.

The chip 508, has two terminals 508*a* and 508*b*, and may be rectangular, having a height dimension "h9" and a width dimension "w9". The rectangular chip 508 also has a diagonal dimension "d9". The chip 508 may, for example, be a chip module measuring measure h9=4.0 mm by w9=6.0 mm, and the diagonal dimension d9=7.2 mm. The height dimension h9 is horizontally oriented in FIG. 5A, and is vertically oriented in FIG. 5B. For purposes of this discussion, the height dimension is less than the width dimension (the height dimension is the smaller of the two rectangular dimensions).

The recess 506 is circular having a diameter "d10". The diameter d10 of the recess may be only slightly larger, such as 0.1 mm-0.3 mm greater, than the diagonal dimension d9 of the chip, such as 7.3 mm-7.5 mm.

In FIGS. 5A and 5C, the chip 508 is shown in its initial position in the recess 506, as it may have been installed, between the wire bridges 510*a* and 510*b*. Note that the end portions 510*a* and 510*b* of the antenna wire 510 do not pass directly over respective terminals 508*a* and 508*b* of the chip 508. Rather, the two end portions 510*a* and 510*b* of the antenna wire, which may be referred to as "wire bridges", span (bridge, pass over) the recess 506, and are spaced apart from one another a distance (s8) which is greater than the height (h5, smaller of the two rectangular dimensions) of the chip 508, so that the chip 508 can be inserted (installed) into the recess 506 from the same side of the substrate as the antenna, past the end portions of the wires, after the antenna 510 has been mounted (embedded in or adhesively placed on) to the substrate 504. Subsequently, as described in greater detail hereinbelow, the chip 508 is moved (re-positioned, manipulated) so that its terminals 508*a* and 508*b* are under respective ones of the end portions 510*a* and 510*b* of the antenna wire 510, for bonding thereto.

The dashed lines extending from the top (as viewed) of the end portion 510*a* and the bottom (as viewed) of the end portion 510*b* indicate that the antenna wire 510 continues, forming the antenna coil (see FIG. 1A). The dots at the bottom (as viewed) of the end portion 510*a* and the top (as viewed) of the end portion 510*b* indicate that the wire ends (stops, does not continue). Depending on antenna configuration, the end portions 510a and 510b could approach the recess from the same side, rather than from opposite sides of the recess.

FIGS. 5A and 5C shows the end portions 510a and 510b of the antenna wire 510 bridging (spanning) the recess 506 near the outer edges thereof, as free-standing loops 520a and 520b. The end portions 510a and 510b of the antenna wire 510 may be spaced (for example) 0.5 mm inward from the respective left and right "side" edges of the cavity 506, in which case the distance s4 between the two wire bridges would be 6.5 mm (7.5 mm−0.5 mm−0.5 mm). Slots 507a and 507b (compare 207a and 207b) are provided on opposite sides of the recess 506, under the bridge loops 520a and 520b, to facilitate laser removal of wire insulation.

In FIGS. 5A and 5C, the chip module 508 is illustrated inserted into the cavity, with its narrower height dimension disposed in a horizontal orientation.

In FIGS. 5B and 5D, the chip module 508 is illustrated as having been rotated (see arrow 518) 90 degrees within the recess 506, so that its larger width dimension is disposed in a horizontal direction. This brings the terminals 508a and 508b into alignment with, substantially directly below corresponding ones of the end portions 510a and 510b of the antenna wire 510, for bonding thereto. The end portions 510a and 510b of the wire 510 may be bonded to the terminals 508a and 508b using any suitable conventional means for bonding (not shown in this figure, see 118 in FIG. 1B).

As a general proposition, a chip is usually square or rectangular, and a chip module can be virtually any shape, including circular. However, as can be seen in this embodiment, the chip (or module) should be larger in one dimension (such as width) than in another orthogonal dimension (such as height), so that (i) it is narrow enough to be inserted between the wire bridges and (ii) when it is rotated 90 degrees, the terminals are repositioned under the wire bridges for being bonded thereto. The rectangular chip (or chip module) 508 illustrated herein is but one example of various chip (or module) shapes that could be used in conjunction with the techniques disclosed herein.

This movement of the chip imparts a relative motion between the chip 508 and the substrate 504, hence between the chip 508 and the end portions 510a and 510b of the wire 510 mounted to the substrate 504, without actually moving the end portions 510a and 510b of the wire 510.

This movement (518) of the chip imparts a relative motion between the chip and the substrate, hence between the chip and the end portions of the wire mounted to the substrate.

In FIG. 5A it can be observed that the two end portions of the antenna wire are spaced a distance (s8) apart which is greater than at least one of the cross dimensions (h5) of the transponder chip; and in FIG. 5B it can be observed that the distance between the two end portions of the antenna wire is substantially equal to a spacing between the terminals of the transponder chip.

In use, a transponder site commences with the wire conductor being mounted into or onto the substrate over a short distance, then drawing the wire conductor over the recess to form a first wire bridge, continuing mounting the wire conductor into or onto the substrate in forming an antenna, then drawing the wire conductor over the cavity on the opposite side of the recess to create a second wire bridge and finally mounting the wire conductor into or onto the substrate over a short distance before cutting the wire.

Generally, the two wire bridges are substantially parallel with one another, and on opposite sides of the recess. With the circular recess shown herein, the wire bridges form parallel "chords" of the circle, both of which are spaced a significant distance (more than 50% of the radius "r") from the center of the circle. However, it is within the scope of the invention that the two wire bridges span the recess so that they are both on the same side of the recess and/or are not parallel with one another. It is also within the scope of the invention that the recess is other than circular, such as rectangular. It is also within the scope of the invention that the chip (or chip module) is other than rectangular, such as circular. (It is noted semiconductor dies are usually rectangular, including square, as a result of the conventional dicing process.)

The chip 508 may be positioned into the recess 506 from above using a conventional pick & place system (not shown).

A conventional suction pipette (not shown) may be used to rotate the chip (from its position shown in FIG. 5A to its position shown in FIG. 5B). A vision system (not shown) may be needed to ensure accurate positioning during relative movement of the chip.

With the situation described herein, both terminals 508a and 508b are simultaneously brought into position under the corresponding wire bridges 510a and 510b. Then, the wire bridges 510a and 510b are bonded to the corresponding terminals 508a and 508b of the chip.

An advantage of this embodiment is that the wire bridges 510a and 510b need not be disturbed prior to bonding. With 112 μm (diameter) wire, pulling the wire from one position to another is not much of a problem, 60 μm wire is also no much of a problem, but with 30 μm wire, it is generally best to leave the wire alone once it is mounted.

Repositioning the Wire Bridges (FIGS. 6A-6D)

As mentioned above, the wire bridges can be initially positioned, spaced sufficiently apart from one another, that the chip (or chip module) can be inserted in to the recess after the wire bridges are in place. In the FIG. 2 embodiment, the chip is then rotated to position the terminals under the wire bridges for bonding. The possibility of initially disposing the wire bridges wider than the chip, then repositioning the wires (rather than the chip) to align the wire bridges over the chip terminals is now discussed.

FIGS. 6A-6D illustrate a transponder site 602 (compare 102, 202) on a substrate 604 (compare 104, 204) which may be a portion of an overall inlay sheet 600 (compare 100, 200), whereby an oversized recess 606 (compare 106 which is not oversize, and 206 which is oversize) is provided for a transponder chip 608 (or chip module, compare 108, 208). The transponder chip 608 may be disposed in the recess 606 after the antenna wire 610 (compare 110, 210) is mounted (embedded in or adhesively place on) the substrate 604.

The chip 608, has two terminals 608a and 608b, and may be rectangular, having a height dimension "h11" and a width dimension "w11". (The rectangular chip 608 also has a diagonal dimension "d11") The chip 608 may, for example, be a chip module measuring measure h11=4.0 mm by w7=6.0 mm (and the diagonal dimension d11=7.2 mm).

The recess 606 is generally circular having a diameter "d12" (diameter not drawn). The diameter "d12" of the recess may be only slightly larger, such as 0.1 mm-0.3 mm greater, than the diagonal dimension "d11" of the chip, such as 7.3 mm-7.5 mm.

The dashed lines extending from the top (as viewed) of the end portion 610a and the bottom (as viewed) of the end portion 610b indicate that the antenna wire 610 continues, forming the antenna coil (see FIG. 1A). The dots at the bottom (as viewed) of the end portion 610a and the top (as viewed) of the end portion 610b indicate that the wire ends (stops, does not continue). Depending on antenna configuration, the end portions 610a and 610b could approach the recess from the same side, rather than from opposite sides of the recess.

The end portions 610a and 610b of the antenna wire 610 which span the recess 606, referred to as "wire bridges", are generally parallel with one another, are spaced a distance "s9" apart from one another, and are disposed on opposite sides of the recess.

The chip 608 is disposed in the recess 606 at a slight angle "a" to horizontal. The angle "a" is suitably approximately 20-30 degrees.

The distance "s9" is slightly greater than the width dimension "w11" of the chip, so that the chip may be inserted (installed) between the wire bridges 610a and 610b, into the recess 606, from the same side of the substrate 604 as the antenna wire 610 is mounted to, but need not be so large as the diagonal dimension "d11" of the chip 608. For a rectangular chip 608 having the exemplary dimensions set forth above (w7=6.0 mm), the distance "s9" may be 6.5-7.0 mm, for example.

In FIGS. 6A and 6C, the chip 608 is shown in its initial position in the recess 606, as it may have been installed, between the wire bridges 610a and 610b. Note that the end portions 610a and 610b of the antenna wire 610 do not pass directly over respective terminals 608a and 608b of the chip 608. Rather, the two end portions 610a and 610b of the antenna wire, which may be referred to as "wire bridges", span (bridge, pass over) the recess 606, and are spaced apart from one another a distance (s9) which is sufficient that the chip (or chip module) 608 may be inserted into the recess 606 from the same side of the substrate 604 as the antenna 610, past the end portions of the wires, after the antenna 610 has been mounted (embedded in or adhesively placed on) to the substrate 604. Subsequently, as described in greater detail hereinbelow, the wire bridges 610a and 610b are re-positioned so as to be substantially directly over respective terminals 608a and 608b of the chip 608, for bonding thereto.

A tool 630 may used to reposition the wire bridges 610a and 610b. The tool 630 is represented somewhat schematically in FIG. 6C. The tool 630 comprises two pins 632a and 632b spaced a distance slightly greater than "s9" apart from one another (best viewed in FIG. 6A), and may be linked to one another by a bar 634, extending from an axle 636. The axle 636 can be mounted to a mechanism (not shown) for rotating (rotationally positioning) the tool 630.

In use, the tool 630 is initially positioned so that the pins 632a and 632b are substantially perpendicular (or "normal") to the surface of the substrate and are located just outside of the wire bridges 610a and 610b, respectively. In FIG. 6A, this initial position of the tool is indicated by the pins 632 and 632b being shown in solid lines. In FIG. 6B, this initial position of the tool is indicated by the pins 632 and 632b being shown in dashed lines.

To reposition the wire bridges 610a and 610b, the tool is rotated, such as 30-60 degrees, which deflects portions of the wire bridges 610a and 610b inward (closer to one another) so that these portions of the wire bridges 610a and 610b are substantially directly over the terminals 608a and 608b of the chip (or chip module) 608, respectively. In FIG. 6B, this rotated position of the tool is indicated by the pins 632 and 632b being shown in solid lines. In FIG. 6A, this rotated position of the tool is indicated by the pins 632 and 632b being shown in dashed lines.

FIG. 6C shows the tool 630 in its initial position, where it can be noted that the wire bridges 610a and 610b are not substantially directly over the terminals 608a and 608b of the chip (or chip module) 608, respectively.

FIG. 6D shows the result of rotating the tool (compare FIG. 6B), with the wire bridges 610a and 610b having been repositioned to be in alignment with, substantially directly above the terminals 608a and 608b of the chip (or chip module) 608, respectively, for bonding thereto. The tool is omitted in this view for illustrative clarity.

Once the wire bridges 610a and 610b have been repositioned to be substantially directly over the terminals 608a and 608b of the chip (or chip module) 608, respectively, the end portions 610a and 610b of the wire 610 may be bonded to the terminals 608a and 608b using any suitable conventional means for bonding (not shown in this figure, see 118 in FIG. 1B). Additionally, the insulation may previously have been removed from the wire bridges and the wire bridges may previously have been flattened to enhance bonding.

In FIG. 6A it can be observed that the two end portions of the antenna wire are initially spaced a distance (s9) apart which is greater than at least one of the cross dimensions (w7) of the transponder chip; and in FIG. 6B it can be observed that the end portions of the antenna wire are repositioned so that the distance between the two end portions of the antenna wire is substantially equal to a spacing between the terminals of the transponder chip, for bonding thereto.

A possible disadvantage of this embodiment (as contrasted with the "rotating the chip" embodiment described hereinabove) is that the wire bridges 610a and 610b need to be manipulated, prior to bonding. With 112 µm (diameter) wire, pulling the wire from one position to another is not much of a problem, 60 µm wire is also no much of a problem, but with 30 µm wire, it is generally best to leave the wire alone once it is mounted.

Rotating the Chip Under "Flat Loops" (FIGS. 7A-7G)

Methods have been described hereinabove wherein the end portions of the wire are pre-positioned and formed as free-standing loops which are wire bridges (220a, 220b) or jump loops (270a, 270b) adjacent terminal areas for the chip. The chip can be inserted onto the substrate (or into a recess in the substrate) between the free-standing loops, which can then be manipulated (re-positioned) to be over terminals of the chip, for bonding thereto. See, for example, FIGS. 2A-2B (wire bridges) and FIG. 2C (jump loops).

A method has been described hereinabove wherein the end portions of the wire are pre-positioned and formed as free-standing loops which are wire bridges (520a, 520b) spanning a recess and, after the chip is disposed past the spaced-apart wire bridges, into the recess, the chip is rotated to position the terminals of the chip under the end portions of the wire, for bonding thereto. See, for example, FIGS. 5A-5D.

This embodiment may be considered to be a "combination" of the "Looping Method" described with respect to FIG. 2C (jump loops) and the "Rotating Chip Method" as described with respect to FIGS. 5A-5D.

In this embodiment, generally, end portions of the antenna wire span the recess in the substrate as wire bridges which are "flat loops" having sufficient height and length to allow ample room for a chip to be inserted therebetween, then rotated (such as 90 degrees) to position the chip terminals under the flat loops. At this stage, the chip may be, but need not be in the recess. Then the rotated (re-positioned) chip is lowered into the recess (and fits snugly therein), and the flat loops are urged downwards (in the z-axis) onto the terminals of the chip and bonded thereto. Prior to introducing the chip, insulation may be removed from relevant portions of the flat loops, as discussed above, including having slots to facilitate laser insulation removal.

FIGS. 7A-7G illustrate an embodiment of the invention, wherein the substrate has a recess or cavity to accommodate a rectangular chip module and the end portions of the antenna wire pass over (span, bridge) the cavity. The antenna is mounted to the front (top) side (surface) of the substrate, and the chip can be inserted into a recess extending only partway through the substrate from the front surface thereof, after the antenna is mounted to the front surface of the substrate. Or, the chip can be inserted in to a cavity extending all the way through the substrate, from the opposite back (bottom) side (surface) of the substrate.

In this embodiment, the end portions of the wire are formed as flat loops passing substantially directly over terminal areas whereat will be located terminals of the transponder chip. This is in contrast to some other embodiments wherein the end portions of the antenna wire are located adjacent to (next to, rather than directly over) the terminal areas of the chip. The transponder chip (or module) may be positioned in the cavity with the end portions of the antenna wire already stretching over (passing over, spanning, bridging) the cavity (or recess) and mounted to (embedded in or adhesively placed onto) the surface of the substrate.

FIGS. 7A-7G illustrate a transponder site 702 (compare 502) on a substrate 504 (compare 104) which may be a portion of an overall inlay sheet 700 (compare 100), whereby a recess 706 (compare 506, which is an "oversize" recess) is provided for a transponder chip 708 (or chip module, compare 508). The transponder chip 708 may be disposed in the recess 706 after the antenna wire 710 (compare 510) is mounted (embedded in or adhesively place on) the substrate 704.

The chip 708, has two terminals 708a and 708b, and may be rectangular, having a height dimension "h12" and a width dimension "w12". The chip 708 may, for example, be a chip module measuring h12=5.0 mm by w12=8.0 mm. The height dimension h12 is horizontally oriented in FIG. 7A, and is vertically oriented in FIG. 7B. For purposes of this discussion, the height dimension is less than the width dimension (the height dimension is the smaller of the two rectangular dimensions).

The recess 706 may be rectangular, having a height dimension "h13" and a width dimension "w13", each of which may be only slightly larger, such as 0.1 mm-0.3 mm greater, than the height and width dimensions "h12" and "w12" of the chip 708, such as 5.1 and 8.1 mm, respectively.

In FIGS. 7A and 7D, the chip 708 is shown in its initial position, above the recess 706, as it may have been installed, between the wire bridges 710a and 710b. Note that in this initial position, the end portions 710a and 710b of the antenna wire 710 do not pass directly over respective terminals 708a and 708b of the chip 708. Rather, the two end portions 710a and 710b of the antenna wire, which may be referred to as "flat loops", span (bridge, pass over) the recess 706, and are spaced apart from one another a distance (s10) which is greater than the height (h12, smaller of the two rectangular dimensions) of the chip 708, so that the chip 708 can be inserted (installed) into the recess 706 from the same side of the substrate as the antenna, past the end portions of the wires, after the antenna 710 has been mounted (embedded in or adhesively placed on) to the substrate 704. Subsequently, as described in greater detail hereinbelow, the chip 708 is moved (re-positioned, manipulated) so that its terminals 708a and 708b are under respective ones of the flat loop 720a and 720b end portions 710a and 710b of the antenna wire 710, for bonding thereto.

In FIGS. 7A and 7B, the dashed lines extending from the top (as viewed) of the end portion 710a and the bottom (as viewed) of the end portion 710b indicate that the antenna wire 710 continues, forming the antenna coil (see FIG. 1A). The dots at the bottom (as viewed) of the end portion 710a and the top (as viewed) of the end portion 710b indicate that the wire ends (stops, does not continue). Depending on antenna configuration, the end portions 710a and 710b could approach the recess from the same side, rather than from opposite sides of the recess.

FIGS. 7A and 7D shows the end portions 710a and 710b of the antenna wire 710 bridging (spanning) the recess 706 within the outer edges thereof, as free-standing loops (flat loops) 720a and 720b. The end portions 710a and 710b of the antenna wire 710 may be spaced (for example) 0.5 mm inward from the respective left and right "side" edges of the cavity 706, in which case the distance s10 between the two flat loops would be 7.1 mm (8.1 mm−0.5 mm−0.5 mm). Slots 707a and 707b (compare 207a and 207b) are provided on opposite sides of the recess 706, under the flat loops 720a and 720b, to facilitate laser removal of wire insulation.

In FIGS. 7A and 7D, the chip module 708 is illustrated inserted between the flat loops, above the recess, into the cavity, with its narrower height dimension "h12" disposed in a horizontal orientation.

In FIGS. 7B and 7E, the chip module 708 is illustrated as having been rotated (see arrow 718) 90 degrees, still above the recess 706, so that its larger width dimension is disposed in a horizontal direction. This brings the terminals 708a and 708b into alignment with, substantially directly below corresponding ones of the flat loop 720a and 720b end portions 710a and 710b of the antenna wire 710, for bonding thereto. The end portions 710a and 710b of the wire 710 may be bonded to the terminals 708a and 708b using any suitable conventional means for bonding (not shown in this figure, see 118 in FIG. 1B). Generally, the end portions 720a and 720b of the antenna wire 710, are sized and shaped to permit the transponder chip 708 to be rotated underneath them.

As a general proposition, a chip is usually square or rectangular, and a chip module can be virtually any shape, including circular. However, as can be seen in this embodiment, the chip (or module) should be larger in one dimension (such as width) than in another orthogonal dimension (such as height), so that (i) it is narrow enough to be inserted between the wire bridges and (ii) when it is rotated 90 degrees, the terminals are repositioned under the wire bridges for being bonded thereto. The rectangular chip (or chip module) 708 illustrated herein is but one example of various chip (or module) shapes that could be used in conjunction with the techniques disclosed herein.

This movement of the chip imparts a relative motion between the chip 708 and the substrate 704, hence between the chip 708 and the end portions 710a and 710b of the wire 710 mounted to the substrate 704, without actually moving the end portions 710a and 710b of the wire 710.

This movement (718) of the chip imparts a relative motion between the chip and the substrate, hence between the chip and the end portions of the wire mounted to the substrate.

In FIG. 7A it can be observed that the two end portions of the antenna wire are spaced a distance (s10) apart which is greater than at least one of the cross dimensions (h12) of the transponder chip; and in FIG. 7B it can be observed that the distance between the two end portions of the antenna wire is substantially equal to a spacing between the terminals of the transponder chip.

In use, a transponder site commences with the wire conductor being mounted into or onto the substrate over a short distance, then drawing the wire conductor over the recess to form a first flat loop, continuing mounting the wire conductor into or onto the substrate in forming an antenna, then drawing the wire conductor over the cavity on the opposite side of the recess to create a second flat loop, and finally mounting the wire conductor into or onto the substrate over a short distance before cutting the wire.

Generally, the two flat loops are substantially parallel with one another, and on opposite sides of the recess. However, it is within the scope of the invention that the two flat loops span the recess so that they are both on the same side of the recess and/or are not parallel with one another. It is also within the scope of the invention that the recess is other than circular, such as rectangular. It is also within the scope of the invention that the chip (or chip module) is other than rectangular, such as circular. (It is noted semiconductor dies are usually rectangular, including square, as a result of the conventional dicing process.)

The chip 708 may be positioned between the flat loops 720a and 720b, rotated, and subsequently lowered into the recess 706 from above using a conventional pick & place system (not shown).

A conventional suction pipette (not shown) may be used to rotate the chip (from its position shown in FIG. 7A to its position shown in FIG. 7B). A vision system (not shown) may be needed to ensure accurate positioning during relative movement of the chip.

With the situation described herein, both terminals 508a and 508b are simultaneously brought into position under the corresponding flat loops 720a and 720b. Then, the flat loops 720a and 720b are bonded to the corresponding terminals 508a and 508b of the chip.

An advantage of this embodiment is that the wire bridges 710a and 710b need not be disturbed prior to bonding. With 112 μm (diameter) wire, pulling the wire from one position to another is not much of a problem, 60 μm wire is also no much of a problem, but with 30 μm wire, it is generally best to leave the wire alone once it is mounted.

In FIG. 7A the end portions 710a and 710b of the antenna wire 710 are shown passing over the recess 706 and transponder chip 708 disposed between the spaced-apart flat loops 720a and 720b, according to an embodiment of the invention. In FIG. 7D it can be seen that in this initial position of the transponder chip 708, the transponder chip 708 is not in the recess. Rather, the transponder chip 708 is located just above the surface of the substrate 704, above the recess 706.

The flat loops 720a and 720b are non-planar portions of the wire, having a height "z5" above the surface of the substrate. The height "z5" should be greater than the thickness "t5" of the transponder chip 708 so that when the transponder chip 708 is rotated, it can fit under the flat loops 720a and 720b without disturbing them. For example, "z5"=1.5 mm, and "t5"=1.0 mm.

In FIG. 7B, the transponder chip 708 has been rotated, such as 90 degrees, so that the terminals 708a and 708b of the transponder chip 708 are located substantially directly under corresponding ones of the flat loops 720a and 720b. In FIG. 7E, it can be seen that the transponder chip 708 is still located just above the surface of the substrate 704, above the recess 706. The longitudinal extent of a flat loops ("P") should also be sufficient to allow the transponder chip 708 to rotate under the flat loops 720a and 720b without disturbing them.

FIG. 7C shows, in dashed lines, the initial position of the transponder chip 708 which fits between the pre-positioned flat loops 720a and 720b, and shows in solid lines the rotated position of the transponder chip 708 with its terminals 708a and 708b substantially directly under corresponding ones of the flat loops 720a and 720b. In FIG. 7C, the loops 720a and 720b are shown slightly offset from the corresponding terminals 708a and 708b, for illustrative clarity.

FIG. 7C (also FIG. 7A) shows a number of points a,b,c,d,e,f,g,h which correspond to the points a,b,c,d,e,f,g,h shown and described with respect to FIG. 2C, but the loops formed between the points b and c, and f and g are "flat loops" rather than "jump loops". In other words, in a manner similar to that described hereinabove, at a point "a" on the surface of the substrate, commencing mounting the antenna wire;
continuing to mount the antenna wire a short distance to a point "b";
forming a first free-standing loop (which is a flat loop, rather than a jump loop) in the wire, between the point "b" and a point "c", directly over (rather than adjacent to) a first terminal area for the transponder chip;
resuming embedding from the point "c" through points "d" and "e", to a point "f";
forming a second free-standing loop (which is a flat loop, rather than a jump loop) in the wire, between the point "f" and a point "g", directly over (rather than adjacent to) a second terminal area for the transponder chip; and
continuing to mount the antenna wire a short distance to a point "h", and at the point "h", and severing the wire.

Generally, the jump loops 270a and 270b (of FIG. 2C) must be sufficiently high so that when they are folded over (see, for example, FIG. 8C), they will reach the terminals to which they will be bonded. In this embodiment, the flat loops 720a and 720b need only be high enough for the transponder chip 708 to fit underneath when it is rotated into position, at which point the flat loops 720a and 720b are substantially directly over the corresponding terminals 708a and 708b, spaced only slightly (such as a fraction of a millimeter therefrom), for bonding thereto. Also, the longitudinal extent (from "b"-to-"c", and from "f"-to-"g") of the jump loops 270a and 270b may be small, in contrast to the longitudinal extent (from "b"-to-"c", and from "f"-to-"g") of the flat loops 720a and 720b, which must allow for the corners of the rectangular (e.g.) chip 708 to pass underneath the flat loops.

In FIG. 7F, the rotated transponder chip 708 is shown dropped (lowered) into the recess 706 prior to bonding the flat loops 720a and 720b to the terminals 708a and 708b of the transponder chip 708.

In FIG. 7G, the rotated transponder chip 708 has been installed in the recess 706, and a bonding tool 760 (compare 118) is shown bonding the flat loop 720a to the terminal 708a (the bonded flat loop is labeled 720' (prime)). rotated transponder chip 708 has been installed in the recess 706. The flat loop 720b will likewise be bonded to the terminal 708b, and its bonded position is shown in dashed lines.

Tools (FIGS. 8A-8D)

Generally speaking, the present invention may be implemented using conventional tools. Some tools have been described hereinabove. Die bonders (such as Kulike and Soffa, Willow Grove, Pa.) use many of the same tools and techniques, such as suction pipette, heated work plate, and the like. A suitable tool for mounting the wire to the substrate is shown in U.S. Pat. No. 6,698,089, and need not be discussed further herein. The use of a laser for removing insulation from the wire bridges has briefly been discussed. The use of a hook or gripper for grabbing and repositioning the wire has been discussed.

FIG. 8A illustrates an exemplary technique for removing insulation from end portions 810a and 810b of an antenna wire 810 (compare 210, 260, 310, 410, 510, 610, 710), according to an aspect of the invention. A substrate 804 (compare 204, 304, 404, 504, 604, 704) has a recess 606 (compare 206, 256, 306, 406, 506, 706), which may include slots (207a/b, such as 707a/b). End portions 810a and 810b (compare 210a/b, 30a/b, 410a/b), are shown as "wire bridges", spanning the recess 606 (or slots), by way of example only. The end portions 610a and 610b of the antenna wire 610 may be any of the free-standing loops described above, such as jump loops (320a, 320b) or flat loops (720a, 720b).

Prior to installing a chip (not shown, see 208, 258, 308, 408, 508, 608, 708) into the recess 806, a laser 811 (such as a UV laser) may be used to direct a beam of light 813 at the end portions 810a and 810b of the antenna wire 810, to remove insulating material (coating, such as enamel) therefrom, which may enhance subsequent bonding to terminals of the chip, and improve thermode ageing, as discussed hereinabove.

FIG. 8B illustrates a technique for repositioning wire bridges, such as discussed hereinabove with respect to FIGS. 2A-2B. A substrate 834 (compare 204) has a recess 836 (compare 206) extending through upper layers 834a (compare 104a) thereof, and slots 837a and 837b 836 (compare 207a and 207b) extending from opposite side edges of the recess 836 completely through the substrate 834, including bottom layers 834b (compare 104b) thereof. Wire bridges 840a and 840b (compare 210a and 210b) extend across the slots 837a and 837b.

After installing a chip 838 (compare 208) in the recess 836 (and after removing insulation from the wire bridges) a hook 842 (gripper tool, or multiple gripper tools, as described hereinabove) is used to grab the wire bridges and move them over to be atop corresponding ones of the terminals 838a and 838b of the chip 838.

In FIG. 8B, the hook 842 is shown getting ready to grab the wire bridge 660b, then drag it over to its new location (shown in dashed lines) atop the terminal 838b, for bonding thereto, as indicated by the arrow 844. The wire bridge 660a will be (or already is) similarly repositioned above the terminal 838a, for bonding thereto.

FIG. 8C shows a substrate 854 (compare 204, 304) with a recess 856 (compare 206, 306) having a transponder chip 858 (compare 208, 308) disposed in the recess 856. The transponder chip 858 has two terminal 858a and 858b (compare 208a/b, 308a/b). An antenna wire 860 (compare 210, 310) is mounted to the substrate 854. Two "jump loops" 860a and 860b (compare 320a/b) are formed in end portions (not separately designated, compare 310a, 310b) of the antenna wire (not separately designated, compare 320).

The loop 860a is shown standing up, pre-positioned, free-standing, in a vertical plane, in preparation for (prior to) being re-positioned to be atop the terminal 858a for connection (bonding) thereto. The loop 860b is shown dashed lines prior to being re-positioned atop the terminal 858b, and in solid lines re-positioned atop the terminal 858b for connection (bonding) thereto.

A simple mechanical tool 862, such as elongate member with a pushing end 864 may be urged against the free-standing loop to push it over onto (above, it need not be touching) the terminal of the substrate, as indicated by the arrow 866. The end 864 may be concave to "capture" the wire.

Alternatively, a "hook" type tool could be used to pull (rather than push) the wire to reposition it over the terminal. A hook type tool is shown in FIG. 8B.

FIG. 8D is a cross-sectional view of an inlay with a chip with wire bridges passing over slots and being flattened, according to an embodiment of the invention.

FIG. 8D illustrates a technique for shaping (flattening) the wire, in preparation for bonding. A substrate 874 (compare 204) has a recess 876 (compare 206) extending through upper layers 874a (compare 104a) thereof, and slots 877a and 877b (compare 220a and 220b) extending from opposite side edges of the recess 876 completely through the substrate 874, including bottom layers 874b (compare 104b) thereof. End portions 880a and 880b (compare 210a and 210b) of an antenna wire 880 (compare 210) extend as "wire bridges" across the slots 877a and 877b.

Before installing a chip 878 (compare 208) in the recess 876, a punch 890 is brought down on the wire bridges 880a and 880b to flatten out the wire from its initial circular cross-section to a flatter cross-section. To facilitate this shaping, the substrate may be disposed on a surface 892 functioning as an anvil, having raised portions 894a and 894b which fit up into the slots 877a and 877b so that the wire does not break when shaping it.

This shaping (flattening) step can be done before or after the step of removing insulation from the wire bridges. In this figure, the wire bridge 880a is shown as having already been flattened, and the wire bridge 880b is in the process of being flattened.

Generally speaking, the tools used to perform the methods described herein are not new, rather they are well known and readily available. Some tools have been described hereinabove. Die bonders (such as Kulike and Soffa, Willow Grove, Pa.) use many of the same tools and techniques, such as suction pipette, heated work plate, and the like.

Insulation Removal

Generally, insulated wire is preferred for the antenna coil because, for example, the wire may need to cross over itself (see "c", FIG. 1A). Although an insulated wire can be bonded to a terminal of a chip (or module), it is desirable to remove the insulation from the wire prior to interconnection (bonding to the terminal of the transponder chip) to ensure that no insulation residue is under the wire conductor at the bond site.

Conventionally, an insulated wire conductor (such as 210 or 319) is bonded to the terminal (such as 208a/b or 308a/b) of a chip (such as 208 or 308) using thermal (or thermo) compression bonding. This is a welding process in which the insulated wire conductor is bonded to the terminal of a chip by passing a current through a thermode, which holds the wire conductor under force against the terminal area of the chip. Typically, the first impulse of current removes the insulation, while the second impulse results in the diffusion of the wire conductor with the terminal area of the chip. To obtain a reasonable deformation of the wire conductor during the bonding process, a force between 1.8 and 2.5 Newton is required. However, the insulation between the wire conductor and the terminal of the chip may not have fully evaporated during the thermal compression bonding process, resulting in an unreliable interconnection. This quality issue may be resolved by removing the insulation before bonding.

One way to remove insulation before bonding would be to pass the wire conductor through a laser tunnel, before the wire conductor is mounted to the substrate. The laser tunnel can be driven by glass fiber connected to a multiplexing diode laser. The inner wall of the tunnel can be coated with a reflective material. The position of the insulation removal can be defined and the length of wire conductor which passes from the laser tunnel to the ultrasonic wire guide tool can be measured. By using an un-insulated wire at the bond position the force required for the diffusion process can be reduced, and better controlled. A 70 watt diode laser (808 nm) connected to a glass fiber (400 microns) can be used to remove a section of insulation layer (polyurethane) with a thickness of 2 to 4 microns from a moving wire conductor having a diameter of approximately 112 microns, by directing the laser beam to the side of the wire conductor under a gas atmospheric condition.

Alternatively, rather than removing insulation from the wire prior to mounting, an insulated wire can be mounted to the substrate, and the insulation from end portions of the insulated wire bridging the recess can be removed with a separate laser system. In such a case, it may be convenient, but it is not necessary, that the recess extends all the way through the substrate. In any case, it is believed to be preferable that the insulation (which may be used to help adhere the wire to the substrate, and to prevent short-circuiting at cross-overs such as "c" in FIG. 1A) is removed at portions (segments) of the end portions of the wire which will be bonded to the terminals of the transponder chip. The insulation can also be removed from loops (320a/b) which are pre-positioned on the substrate, adjacent a recess. To facilitate insulation removal, the recess (or slot extensions thereof, or separate slots adjacent the recess) can extend under the loops. Note that, in FIG. 2A, the slots 207a and 207b are under the wire-bridges of the end portions 210a, 210b of the wire 210—in other words, under the portion of the free-standing loops whereat the insulation is removed.

When using a laser to remove insulation (non-conductive coating, typically enamel) from a wire conductor, in order to facilitate the interconnection of an insulated wire conductor to the terminal areas of an RFID chip, the enamel coating on the wire can be dyed with a dark color (such as black), to enhance absorption of the laser beam, hence heating (and evaporation) of the coating. A bare wire can also be blackened (the enamel is colored black) to increase the absorption of the laser beam, such as when performing interconnection of the wire to a terminal of a chip by laser welding. When using a laser to remove insulation, the wires can be attached to the terminals by conventional thermal compression bonding, or by laser welding, soldering, etc.

A Manufacturing Flow

FIG. 9 illustrates a manufacturing flow 900, showing a possible organization for the various manufacturing steps set forth hereinabove.

In a first step 902, a substrate is prepared. The substrate may have one or more (an array of) inlay sites. The substrate may be a multi-layer substrate, as discussed above. A given inlay site may have a recess (cavity, window) and may have slots, as described above. Substrates may be prepared well ahead of time, "off-line".

In a next step 904, and antenna wire is mounted to (embedded in, adhesively placed on) the substrate, as discussed above, leaving end portions of the wire unmounted, and forming pre-positioned bridges or loops (ump loops, flat loops), according to any of the embodiments discussed hereinabove, all of which may be referred to as "free-standing loops".

Two mounting procedures have been discussed hereinabove—(1) embedding the wire in the surface of the substrate, and (2) "adhesively positioning" a self-bonding wire to the surface of the substrate.

In a next step 906, which can be skipped if the wire is being embedded in rather than adhesively placed on the substrate, the self-bonding wire may be cured to the substrate, such as by using ultraviolet light, as discussed hereinabove.

In a next step 908, which can be skipped if the wire is not insulated, the insulation is removed from the looped (unmounted) portions of the wire, as discussed hereinabove. If the wire is an insulated wire, the insulation can be removed either during mounting or after mounting, as discussed hereinabove.

In the process flow illustrated here, in a next step 910, the transponder chip is brought to the inlay substrate after mounting the wire and pre-positioning the end portions of the wire. In some embodiments (for example, FIGS. 6A-6D), the transponder chip is installed in the recess. In other embodiments (for example, FIGS. 7A-7E), the chip is positioned above the recess in the substrate to be rotated into position, under the free-standing loops. Again, it should be understood that the substrate may be set up for a plurality of inlays, receiving a plurality of transponder chips, such as a 3×6 array of inlays.

Next, using one of the techniques described hereinabove, the end portions of the antenna wire(s) are repositioned over terminals of the transponder chip, or the transponder chip is brought into position under the end portions of the antenna wire(s), in preparation for connecting (bonding) the ends of the antenna wire(s) to the terminals of the chip, as discussed hereinabove. This is shown by steps 912a-912f.

The antenna may be a single wire coil having two ends, or may be two wires forming a dipole, each of the dipole wires having one end for connecting to a terminal of the transponder chip, as discussed above.

In the step 912a, the wire bridges (which are "free-standing loops") are re-positioned to be over the terminals of the chip, and the wires are bonded to the terminals, such as described hereinabove with respect to FIGS. 2A-2B.

In the step 912b, the chip is moved from side-to-side to position its terminals under the corresponding wire bridges (which are "free-standing loops"), and the wires are bonded to the terminals, such as described hereinabove with respect to FIGS. 3A-3E.

In the step 912c, the substrate is moved from side-to-side to position the chip's terminals under the corresponding wire bridges (which are "free-standing loops"), and the wires are bonded to the terminals, such as described hereinabove with respect to FIGS. 4A-4E.

In the step 912d, the chip is rotated within a recess to position its terminals under the corresponding wire bridges (which are "free-standing loops"), and the wires bridges are bonded to the terminals, such as described hereinabove with respect to FIGS. 5A-5D.

In the step 912e, the wire bridges (which are "free-standing loops") are re-positioned to be over the terminals of the chip, and the wires are bonded to the terminals, such as described hereinabove with respect to FIGS. 6A-6D.

In the step 912f, the chip is rotated under the "free-standing loops", which are flat loops, to position its terminals under the corresponding flat loops, and the flat loops are bonded to the terminals, such as described hereinabove with respect to FIGS. 7A-7G Next in a step 914, the "free-standing loops" of the antenna(s), now positioned over corresponding terminals of the transponder chip, are connected (bonded) to the terminals of the transponder chip.

Next, in a step 916, various post-processing steps may be performed, such as assembling the transponder inlay with additional layers of sheets in preparation for lamination In a step 918, if there are a plurality of inlays on a common substrate, they may be singulated (separated) from the substrate.

In a step 920, various post-processing steps applicable to individual secure inlays may be performed.

Generally, each of the steps discussed hereinabove may be performed at a different station, or stations, in a manufacturing environment. This has various advantages, such as improved yields from the manufacturing process and greater throughput from the embedding machine with fewer operators.

One of ordinary skill in the art will readily understand how this, or other steps recited in this "fab flow" may be rearranged, recombined and/or omitted to suit particular circumstances, based on the teachings set forth herein.

The techniques set forth herein can be used for winding a coil according to the radial or flyer priniciple", such as a moving coil of a loudspeaker unit that is integrally connected to a vibrating diaphragm, or a coil on a ferrite core, and making connections thereto. The techniques set forth herein can be used for optical fiber instead of wire, and the connection techniques described above could be used to connect with optical sensors.

While the invention has been described with respect to a limited number of embodiments, these should not be construed as limitations on the scope of the invention, but rather as examples of some of the embodiments. Those skilled in the art may envision other possible variations, modifications, and implementations that are also within the scope of the invention, based on the disclosure(s) set forth herein.

What is claimed is:

1. Method of connecting an antenna wire to a transponder chip comprising:
providing a recess in a surface of the substrate for receiving the transponder chip;
mounting the antenna wire to a surface of a substrate so that two end portions of the antenna wire span the recess;
disposing the transponder chip into the recess, past the end portions of the antenna wire;
after disposing the transponder chip between the end portions of the antenna wire, rotating the transponder chip so that terminals of the transponder chip are in alignment with corresponding ones of the end portions of the antenna wire, for bonding thereto.

2. The method of claim 1, wherein:
the end portions comprise wire bridges, jump loops, or flat loops.

3. The method of claim 1, further comprising:
subsequently bonding the end portions of the antenna wire to corresponding terminals of the transponder chip.

4. The method of claim 1, further comprising:
removing insulation from the end portions of the wire prior to bonding.

5. The method of claim 4, further comprising:
providing slots in the substrate, under the end portions of the wire.

6. The method of claim 1, wherein:
the recess is sufficiently large to allow for said rotation of the transponder chip while it is in the recess.

7. The method of claim 1, wherein:
the end portions of the antenna wire are sized and shaped to permit the transponder chip to be rotated underneath them.

8. The method of claim 1, wherein mounting the antenna wire comprises:
embedding the antenna wire in the surface of the substrate or adhesively placing the antenna wire on the surface of the substrate.

9. The method of claim 1, wherein the substrate is a multi-layer substrate.

10. Method of connecting an antenna wire to a transponder chip comprising:
providing a recess in a surface of a substrate;
mounting the antenna wire to the surface of the substrate so that two end portions of the antenna wire span the recess;
disposing the chip in the recess, between the two end portions of the antenna wire; and
imparting at least one relative motion between the chip and the substrate so that a first terminal of the chip is positioned under a first of the two end portions of the wire for bonding thereto and so that a second terminal of the chip is positioned under a second of the two end portions of the wire for bonding thereto;
wherein:
the relative motion is imparted by moving the chip relative to a stationary substrate.

11. The method of claim 10, further comprising:
subsequently bonding the end portions of the antenna wire to corresponding terminals of the chip.

12. The method of claim 10, further comprising:
removing insulation from the end portions of the wire prior to bonding.

13. The method of claim 12, further comprising:
providing slots in the substrate, under the end portions of the wire.

14. The method of claim 10, wherein mounting the antenna wire comprises:
embedding the antenna wire in the surface of the substrate or adhesively placing the antenna wire on the surface of the substrate.

15. The method of claim 10, wherein the substrate is a multi-layer substrate.

16. The method of claim 10, further comprising:
removing insulation from at least a portion of the wire using a laser.

17. Method of preparing a transponder site comprising:
providing an inlay substrate;
providing a recess for receiving a chip module in a surface of the inlay substrate;
mounting an antenna wire to the surface of the inlay substrate with two end portions of the antenna wire spanning the recess;
inserting a chip module having two terminals into the recess, from the same side of the substrate as the antenna, past the end portions of the antenna wires; and
rotating the chip module in the recess so that the terminals of the chip module are in alignment with corresponding ones of the end portions of the antenna wire, for bonding thereto.

18. The method of claim 17, further comprising:
subsequently bonding the end portions of the antenna wire to corresponding terminals of the chip module.

19. The method of claim 17, further comprising:
removing insulation from the end portions of the wire prior to bonding.

20. The method of claim 17, wherein:
the recess is sufficiently large to allow for said rotation of the chip module while it is in the recess.

21. The method of claim 17, wherein mounting the antenna wire comprises:
embedding the antenna wire in the surface of the substrate or adhesively placing the antenna wire on the surface of the substrate.

22. The method of claim 17, wherein the substrate is a multi-layer substrate.

23. The method of claim 17, further comprising:
removing insulation from at least a portion of the wire using a laser.

* * * * *